United States Patent
Marimuthu et al.

(10) Patent No.: US 9,978,665 B2
(45) Date of Patent: May 22, 2018

(54) SEMICONDUCTOR DEVICE AND METHOD OF FORMING LOW PROFILE FAN-OUT PACKAGE WITH VERTICAL INTERCONNECTION UNITS

(71) Applicant: STATS ChipPAC Pte. Ltd., Singapore (SG)

(72) Inventors: Pandi C. Marimuthu, Singapore (SG); Il Kwon Shim, Singapore (SG); Yaojian Lin, Jiangyin (CN); Won Kyoung Choi, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days. days.

(21) Appl. No.: 15/611,110

(22) Filed: Jun. 1, 2017

(65) Prior Publication Data

US 2017/0271241 A1    Sep. 21, 2017

Related U.S. Application Data

(63) Continuation of application No. 14/038,575, filed on Sep. 26, 2013, now Pat. No. 9,704,780.

(Continued)

(51) Int. Cl.
*H01L 21/00* (2006.01)
*H01L 23/48* (2006.01)
(Continued)

(52) U.S. Cl.
CPC ...... *H01L 23/481* (2013.01); *H01L 23/49833* (2013.01); *H01L 24/19* (2013.01);
(Continued)

(58) Field of Classification Search
CPC ............. H01L 23/481; H01L 23/49833; H01L 25/0657; H01L 24/96; H01L 24/19
See application file for complete search history.

(56) References Cited

U.S. PATENT DOCUMENTS

| 4,509,994 A | 4/1985 | Barajas |
| 5,172,851 A | 12/1992 | Matsushita et al. |

(Continued)

OTHER PUBLICATIONS

DS Hi-Metal Beyond Materials, DSHM Epoxy Flux EFSCH-026, Technical Data Sheet, Rev2, Aug. 1, 2011, 1 page.

(Continued)

*Primary Examiner* — Alexander Sofocleous
*Assistant Examiner* — Vicki B Booker
(74) *Attorney, Agent, or Firm* — Brian M. Kaufman; Robert D. Atkins; Patent Law Group: Atkins and Associates, P.C.

(57) ABSTRACT

A semiconductor device includes a semiconductor die. A first interconnect structure is disposed over a peripheral region of the semiconductor die. A semiconductor component is disposed over the semiconductor die. The semiconductor component includes a second interconnect structure. The semiconductor component is disposed over the semiconductor die to align the second interconnect structure with the first interconnect structure. The first interconnect structure includes a plurality of interconnection units disposed around first and second adjacent sides of the semiconductor die to form an L-shape border of the interconnection units around the semiconductor die. A third interconnect structure is formed over the semiconductor die perpendicular to the first interconnect structure. An insulating layer is formed over the semiconductor die and first interconnect structure. A plurality of vias is formed through the insulating layer and into the first interconnect structure with the second interconnect structure disposed within the vias.

25 Claims, 20 Drawing Sheets

Related U.S. Application Data

(60) Provisional application No. 61/735,926, filed on Dec. 11, 2012.

(51) Int. Cl.
*H01L 23/00* (2006.01)
*H01L 23/498* (2006.01)
*H01L 25/065* (2006.01)
*H01L 21/56* (2006.01)
*H01L 23/538* (2006.01)

(52) U.S. Cl.
CPC .......... *H01L 24/96* (2013.01); *H01L 25/0657* (2013.01); *H01L 21/568* (2013.01); *H01L 23/5389* (2013.01); *H01L 24/03* (2013.01); *H01L 24/05* (2013.01); *H01L 24/11* (2013.01); *H01L 24/13* (2013.01); *H01L 24/16* (2013.01); *H01L 24/94* (2013.01); *H01L 2224/03* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/04105* (2013.01); *H01L 2224/05548* (2013.01); *H01L 2224/05567* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16225* (2013.01); *H01L 2224/16237* (2013.01); *H01L 2224/32145* (2013.01); *H01L 2224/73204* (2013.01); *H01L 2224/73267* (2013.01); *H01L 2224/81191* (2013.01); *H01L 2224/81192* (2013.01); *H01L 2224/94* (2013.01); *H01L 2225/06513* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/18162* (2013.01); *H01L 2924/3511* (2013.01)

(56) References Cited

U.S. PATENT DOCUMENTS

| | | | |
|---|---|---|---|
| 5,346,118 | A | 9/1994 | Degani et al. |
| 5,564,617 | A | 10/1996 | Degani et al. |
| 5,817,545 | A | 10/1998 | Wang et al. |
| 6,043,510 | A | 3/2000 | Kawamoto |
| 6,324,069 | B1 | 11/2001 | Weber |
| 7,087,458 | B2 | 8/2006 | Wang et al. |
| 7,528,474 | B2 | 5/2009 | Lee |
| 7,750,454 | B2 * | 7/2010 | Carson ................... H01L 25/03 257/686 |
| 8,071,470 | B2 | 12/2011 | Khor et al. |
| 2004/0207077 | A1 | 10/2004 | Leal et al. |
| 2005/0121769 | A1 | 6/2005 | Walls et al. |
| 2006/0267175 | A1 | 11/2006 | Lee |
| 2007/0100048 | A1 | 5/2007 | Kim et al. |
| 2007/0132536 | A1 | 6/2007 | Lee et al. |
| 2009/0134528 | A1 | 5/2009 | Lee et al. |
| 2009/0206480 | A1 | 8/2009 | Lam |
| 2009/0236686 | A1 | 9/2009 | Shim et al. |
| 2010/0038764 | A1 | 2/2010 | Lyne |
| 2011/0012266 | A1 | 1/2011 | Horiuchi et al. |
| 2011/0278736 | A1 | 11/2011 | Lin et al. |
| 2012/0241955 | A1 | 9/2012 | Law et al. |
| 2013/0154091 | A1 | 6/2013 | Wright et al. |

OTHER PUBLICATIONS

DS Hi-Metal Beyond Materials, Epoxy Flux Introduction, pp. 1-33.
Alpha Advanced Materials, Low Temperature Processing, ALPHA Low Temperature SMT (Surface Mount Technology) Soldering/Processing, Webpage, http://alphacpmd.com/Products/Solder-Paste/Low-Temperature-Processing, 2013. pp. 1-3.
Superior Flux & Mfg. Co., Material Safety Data Sheet, Superior No. 1265 Paste, Jan. 1, 2012, pp. 1-3.
Superior Flux & Mfg. Co., Superior 1265, Aluminum Paste Flux, 1 page.
Superior Flux & Mfg. Co., Material Safety Data Sheet, Superior AL26-33-75, May 24, 2012, pp. 1-4.
Superior Flux & Mfg. Co., Superior Solder Paste AL-26-33-75, Direct Aluminum Solderpaste Using SN96.5/AG3.5, pp. 1-2.
Avery, William F., Direct Aluminum Soldering Paste, IMAPS Thermal Management 2011 Workshop.
Air Products, Better Process Solutions for Direct Benefits at Test & Assembly, Sep. 13, 2010, pp. 1-24.

* cited by examiner

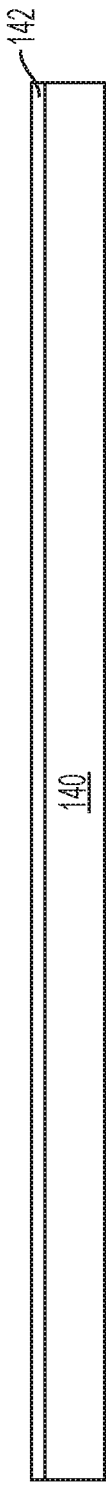
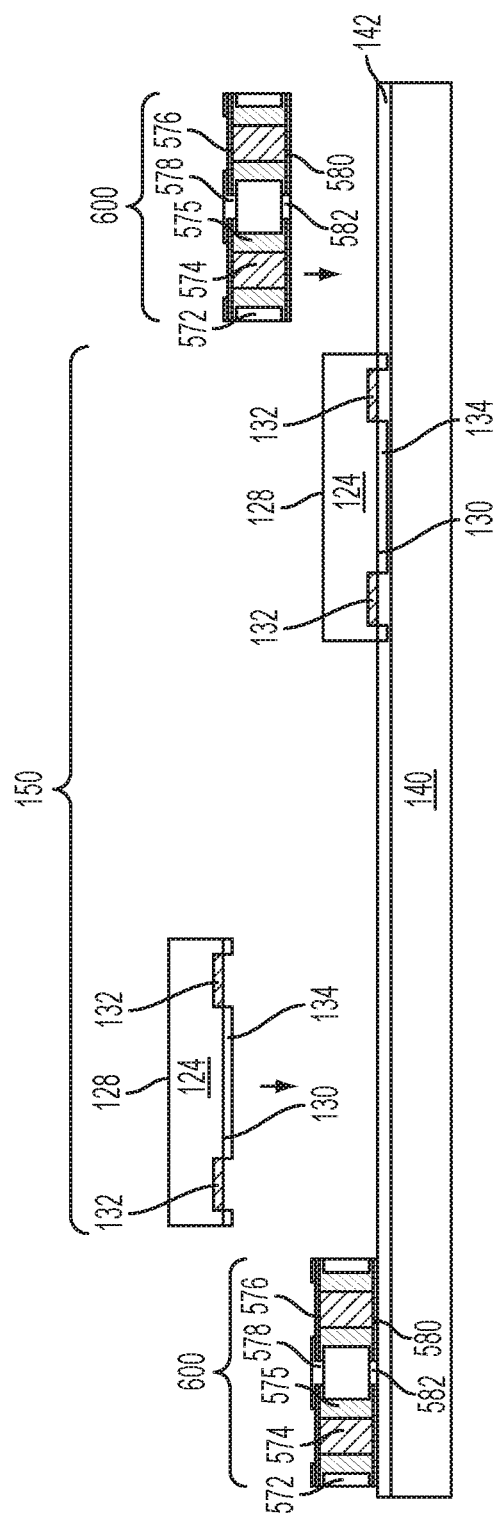

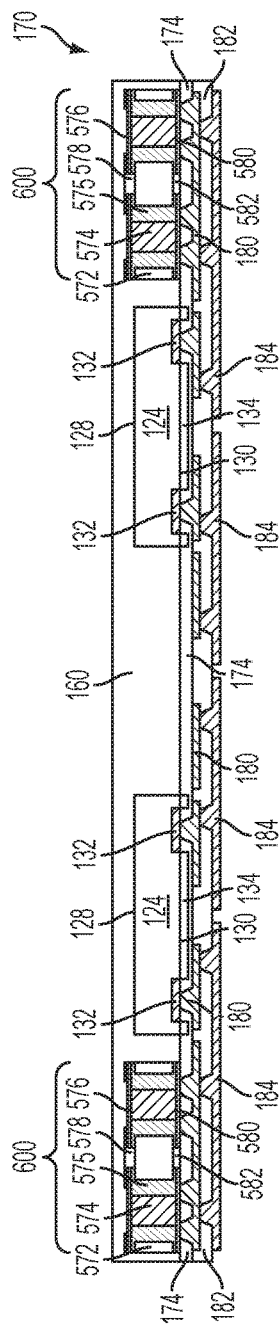

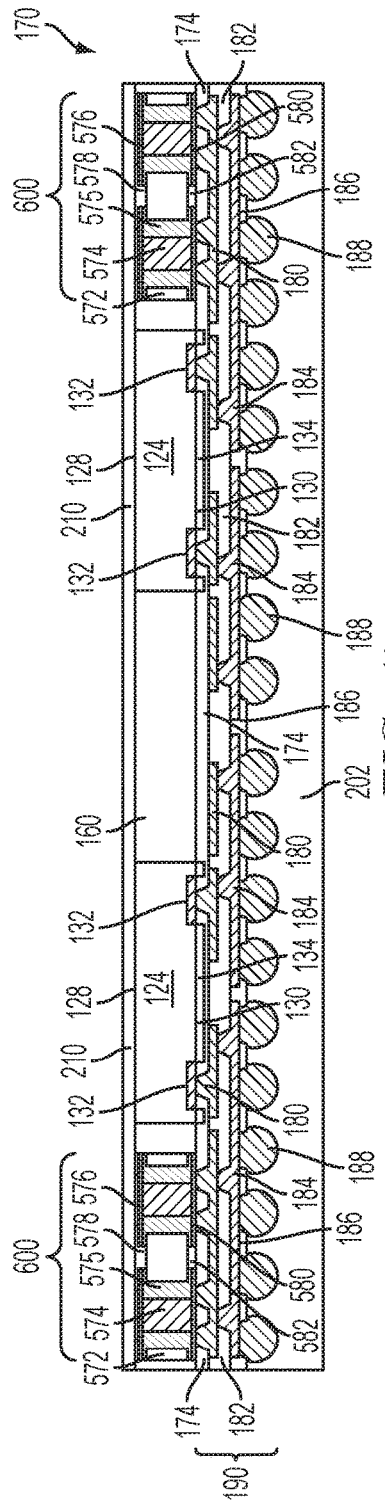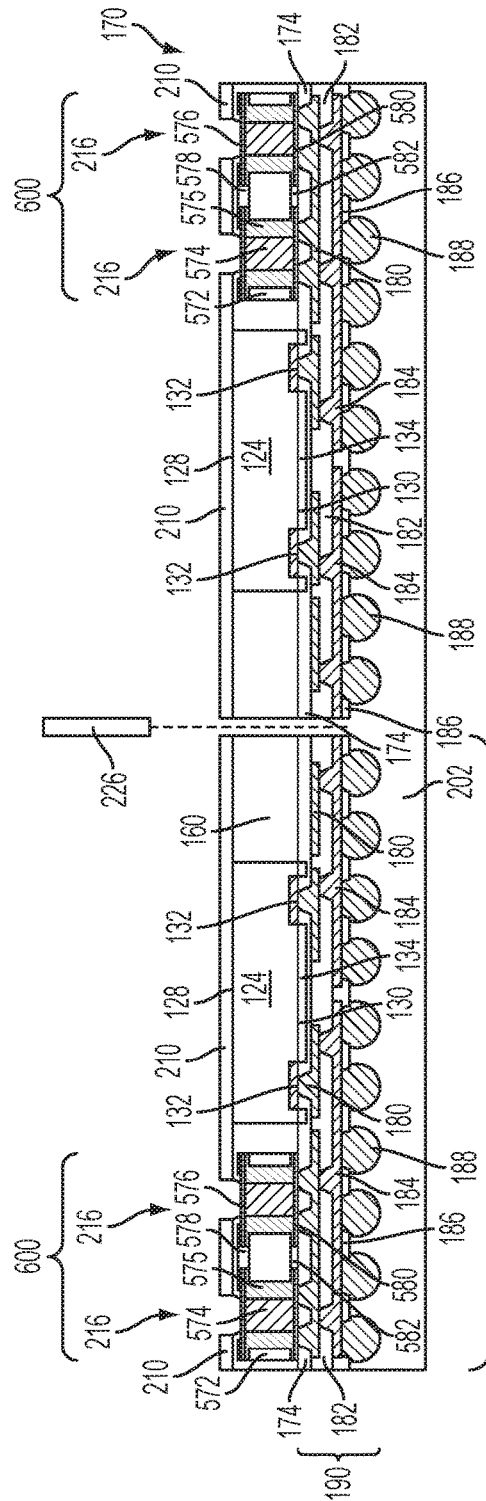

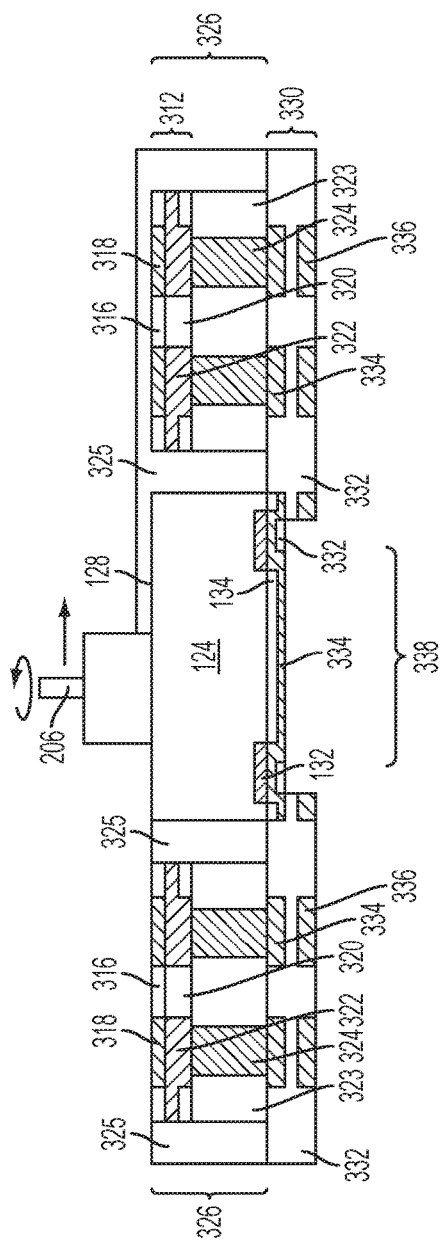
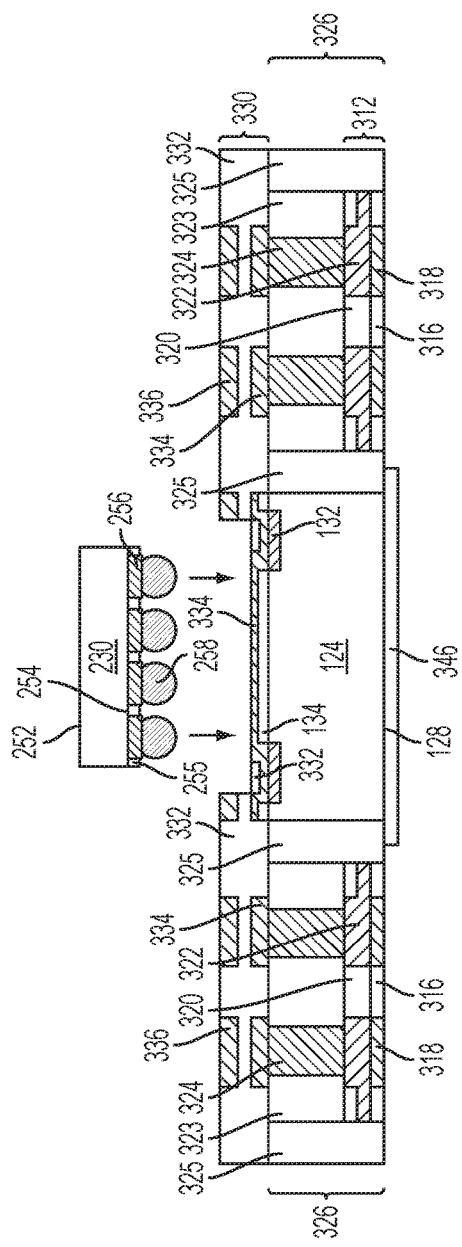

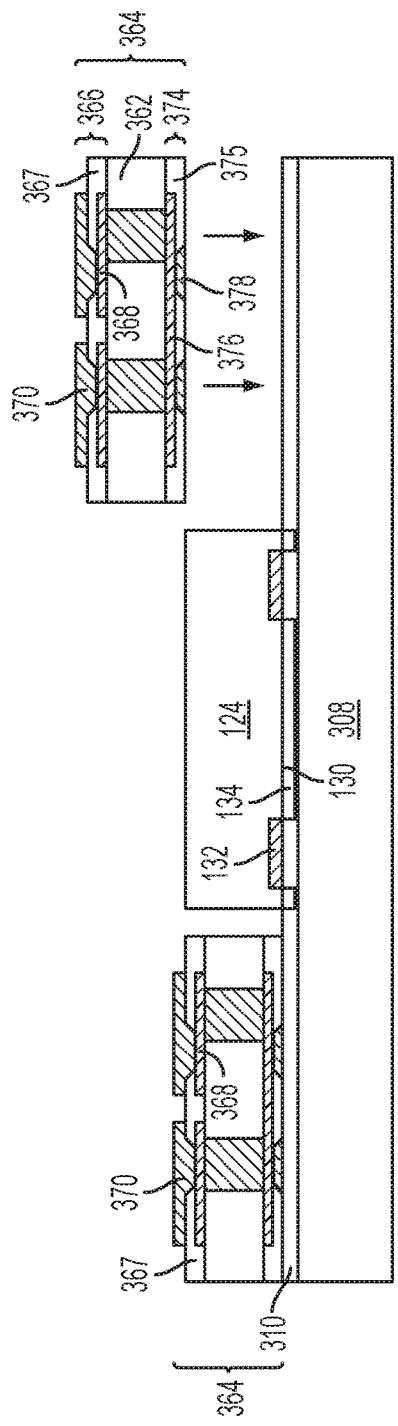
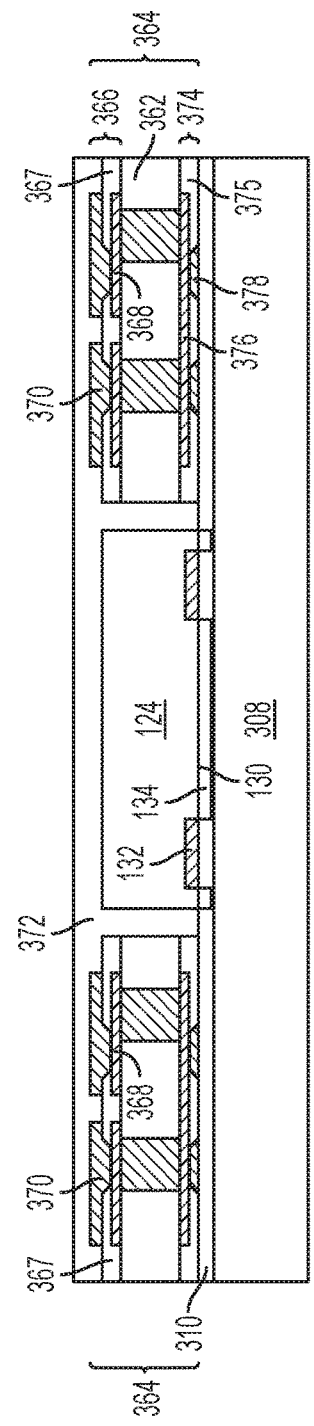
FIG. 8a
FIG. 8b

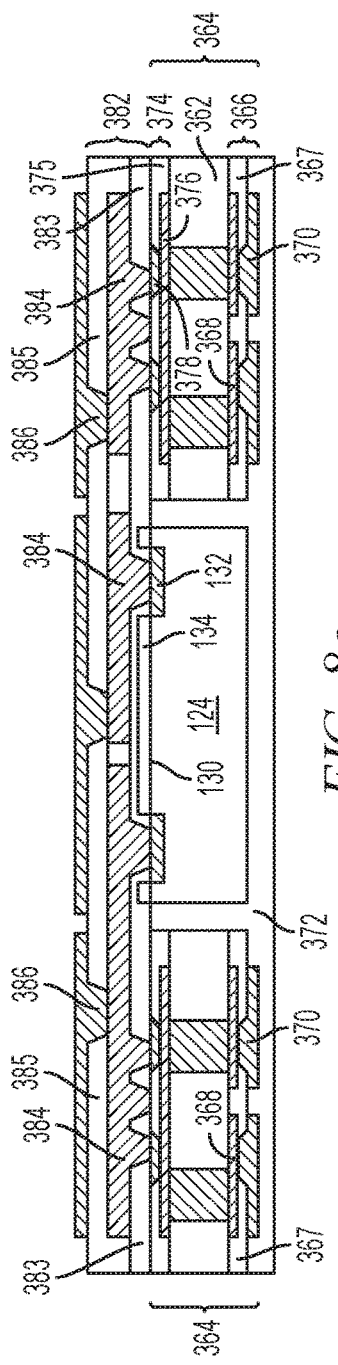
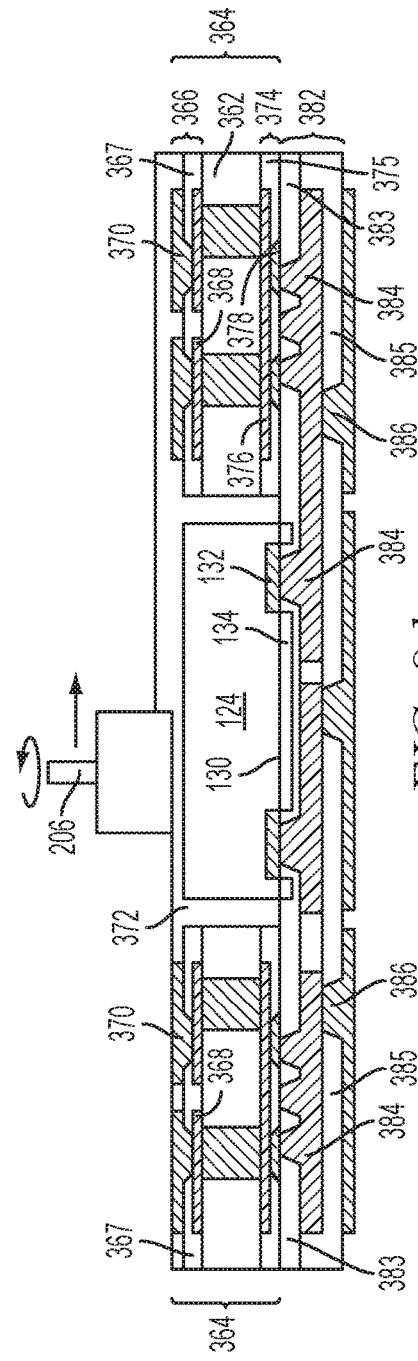

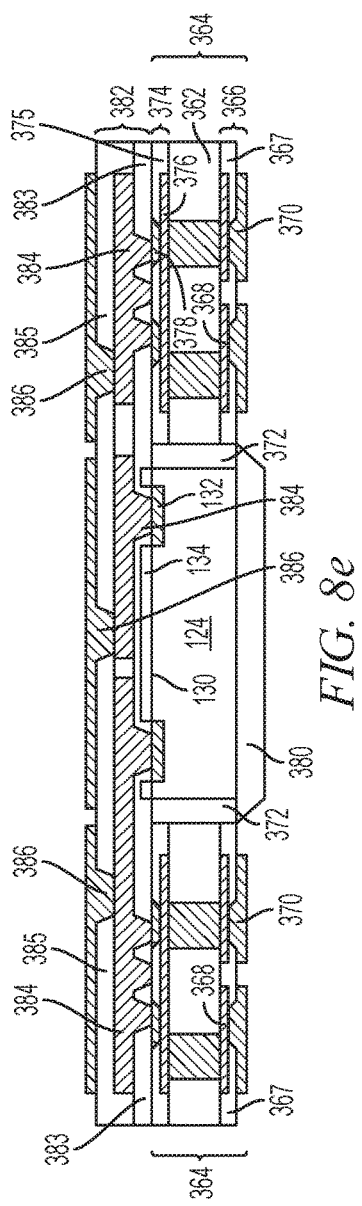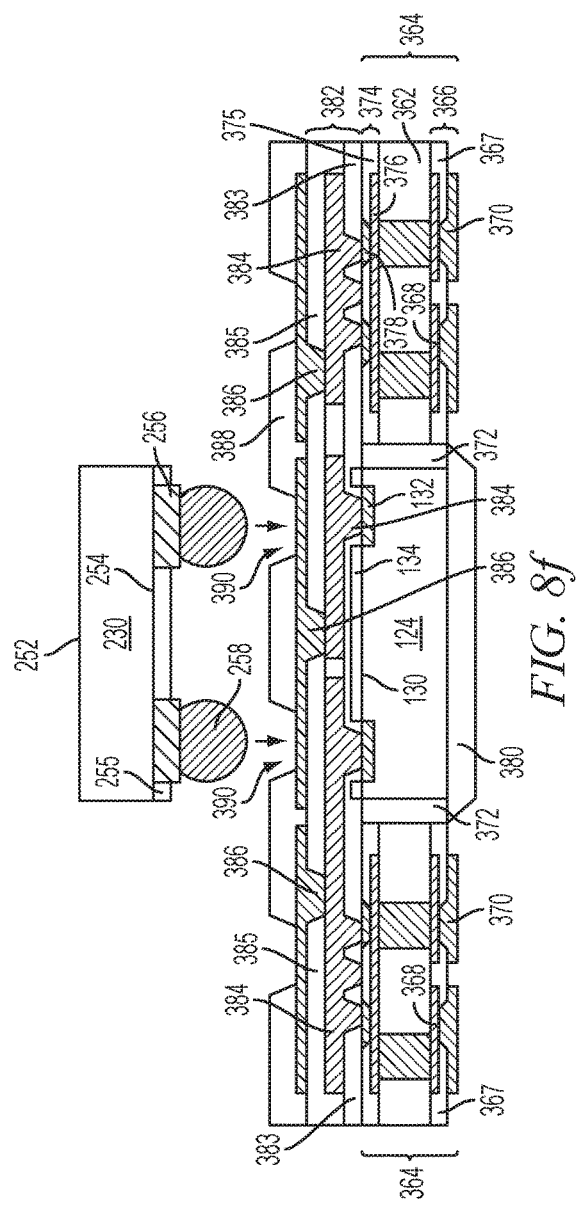

SEMICONDUCTOR DEVICE AND METHOD OF FORMING LOW PROFILE FAN-OUT PACKAGE WITH VERTICAL INTERCONNECTION UNITS

CLAIM TO DOMESTIC PRIORITY

The present application is a continuation of U.S. patent application Ser. No. 14/038,575, now U.S. Pat. No. 9,704,780, filed Sep. 26, 2013, which claims the benefit of U.S. Provisional Application No. 61/735,926, filed Dec. 11, 2012, which applications are incorporated herein by reference.

FIELD OF THE INVENTION

The present invention relates in general to semiconductor devices and, more particularly, to a semiconductor device and method of forming a fan-out package or package-on-package semiconductor device with vertical interconnection units.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A reduced package profile is of particular importance for packaging in the cellular or smart phone industry. The electrical interconnection between three dimensional (3D) fan-out semiconductor packages and external devices utilize various interconnect types, such as through silicon vias (TSVs) and through hole vias (THVs) interconnect by redistribution layers (RDLs). RDLs serve as intermediate layers for electrical interconnect within a package including electrical interconnect with package input/output (I/O) pads which provide electrical connection from a semiconductor die within a semiconductor package to points external to the semiconductor package. RDLs can be formed over both a front surface and back surface of the semiconductor die within the semiconductor package and with a thin wafer and panel handling capability. However, the formation of multiple RDLs over a front surface and back surface of the semiconductor die can require temporary bonding with customized bonding material, which can require higher temperature resistance, and can be a slow and costly approach for making electrical interconnection for the semiconductor package resulting in higher fabrication costs. Additionally, thin stacks of RDLs include structural limitations and reduced design flexibility. For example, RDLs provide limited mechanical strength for package processing and reliability. RDLs lack modularity and are difficult to form in specific areas of the semiconductor package.

BRIEF DESCRIPTION OF THE DRAWINGS

FIGS. 6a-6h illustrate another semiconductor package with interconnection units disposed over opposing surfaces of a semiconductor die and support structures;

FIGS. 8a-8g illustrate another semiconductor package with RDL formed between semiconductor packages and a back surface protection layer.

DETAILED DESCRIPTION OF THE DRAWINGS

Figure 1:
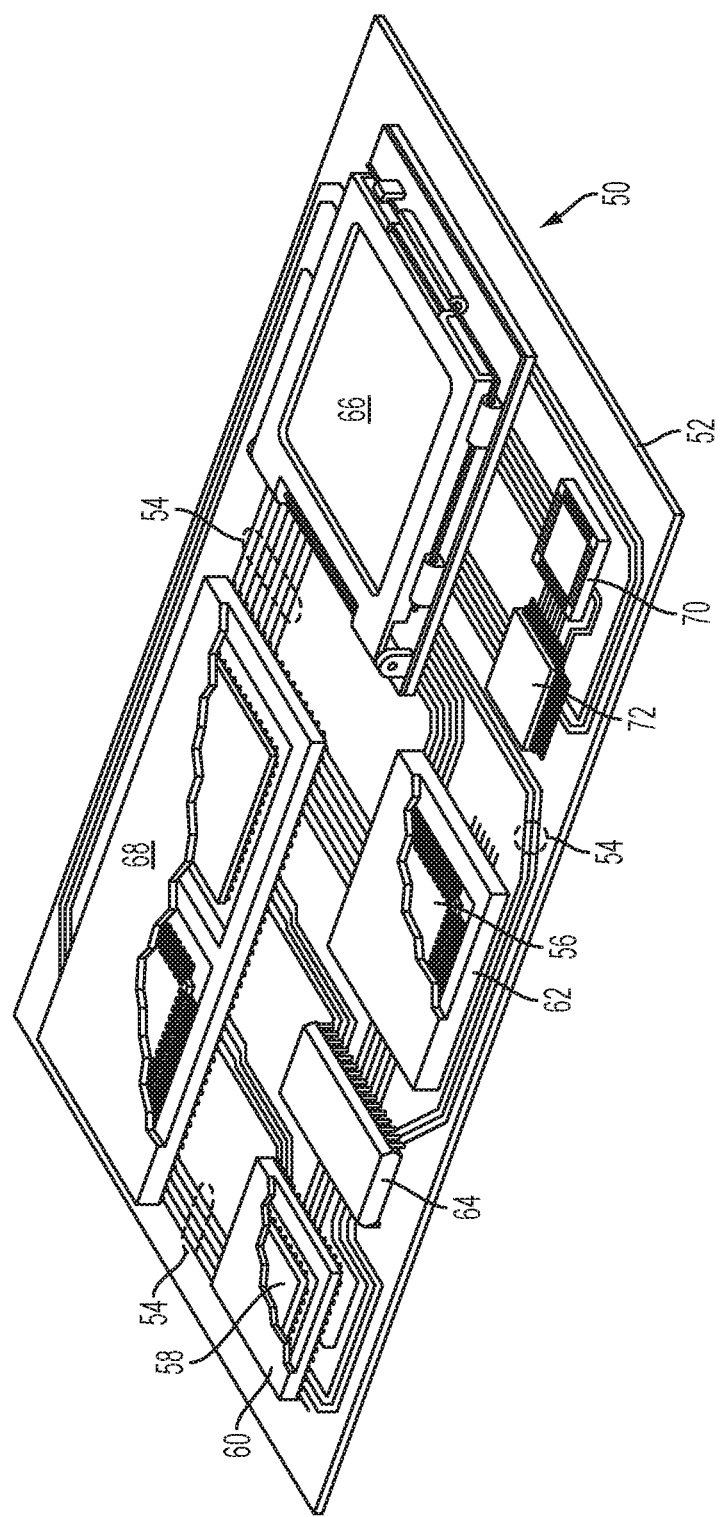
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
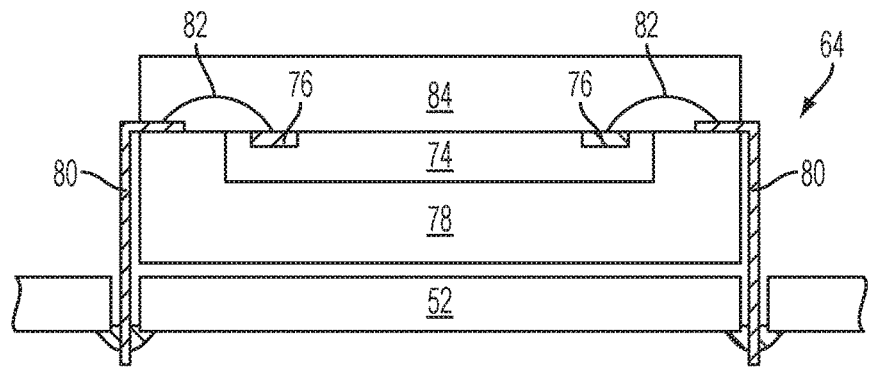
FIGS. 2a-2c illustrate further detail of the representative semiconductor packages mounted to the PCB.
Figure 2B:
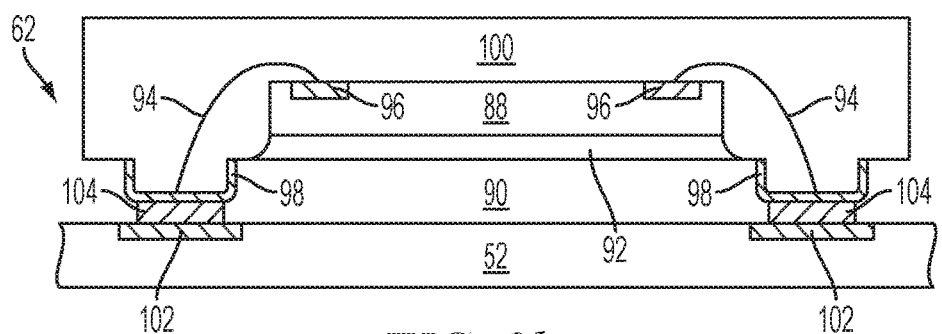
Figure 2C:
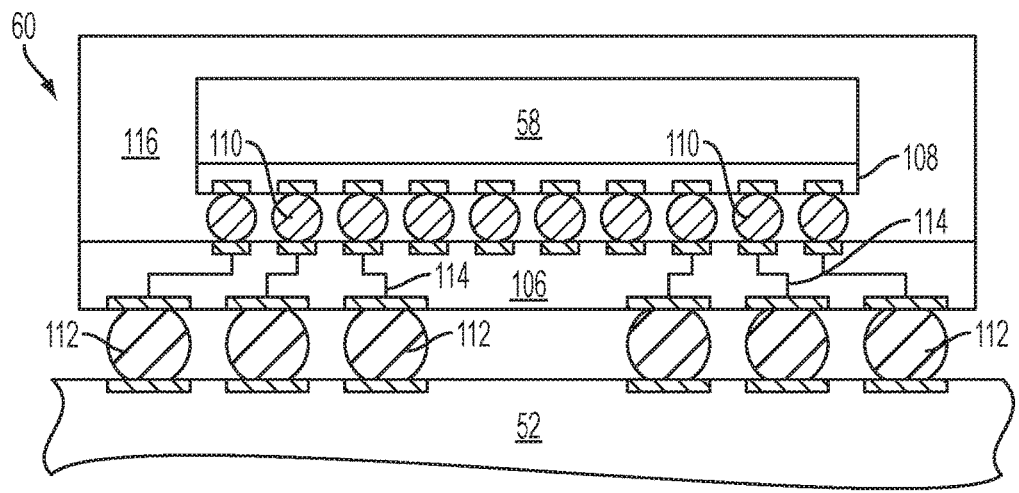

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
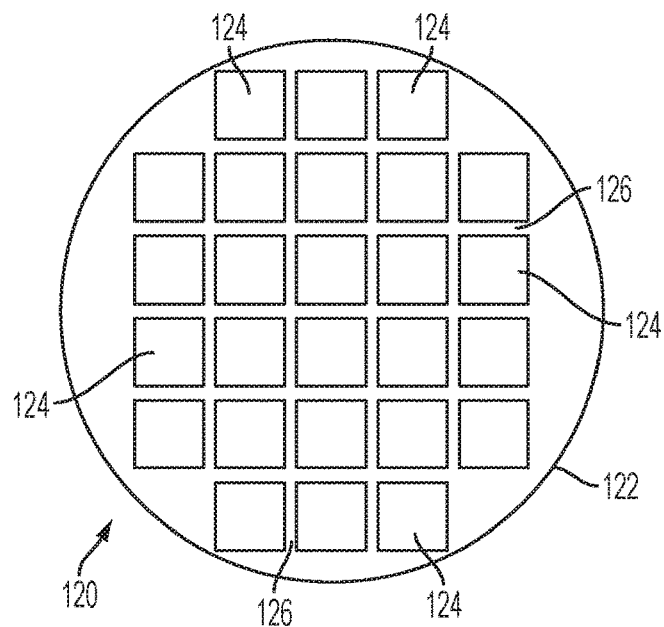
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
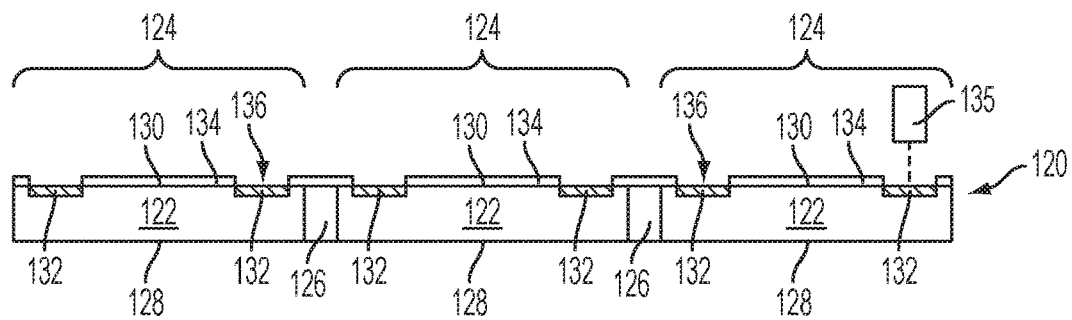

FIG. 3b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An optional insulating or passivation layer 134 is formed over active surface 130 using PVD, CVD, screen printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 134 covers and provides protection for active surface 130. A portion of insulating layer 134 is removed by an etching process or by laser direct ablation (LDA) using laser 135 to form openings 136 which expose conductive layer 132 and provide for subsequent electrical interconnect.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters using a probe or other testing device. A probe is used to make electrical contact with nodes or contact pads 132 on each semiconductor die 124 and provides electrical stimuli to the contact pads. Semiconductor die 124 responds to the electrical stimuli, which is measured and compared to an expected response to test functionality of the semiconductor die. The electrical tests may include circuit functionality, lead integrity, resistivity, continuity, reliability, junction depth, electro-static discharge (ESD), radio frequency (RF) performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3C:
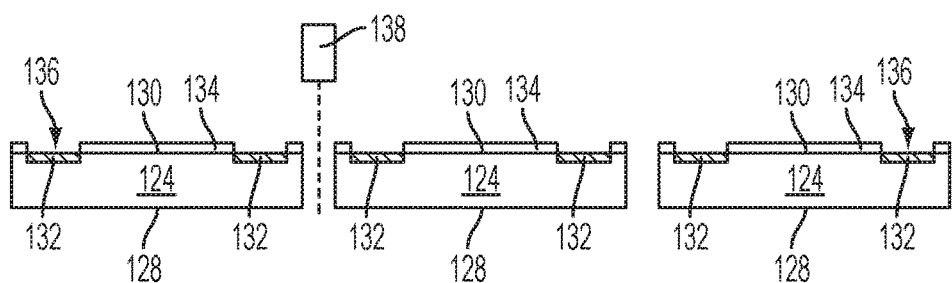

In FIG. 3c, semiconductor wafer 120 is singulated through saw street 126 using a saw blade or laser cutting tool 138 into individual semiconductor die 124. The individual semiconductor die 124 can be inspected and electrically tested for identification of KGD post singulation.

Figure 4C:
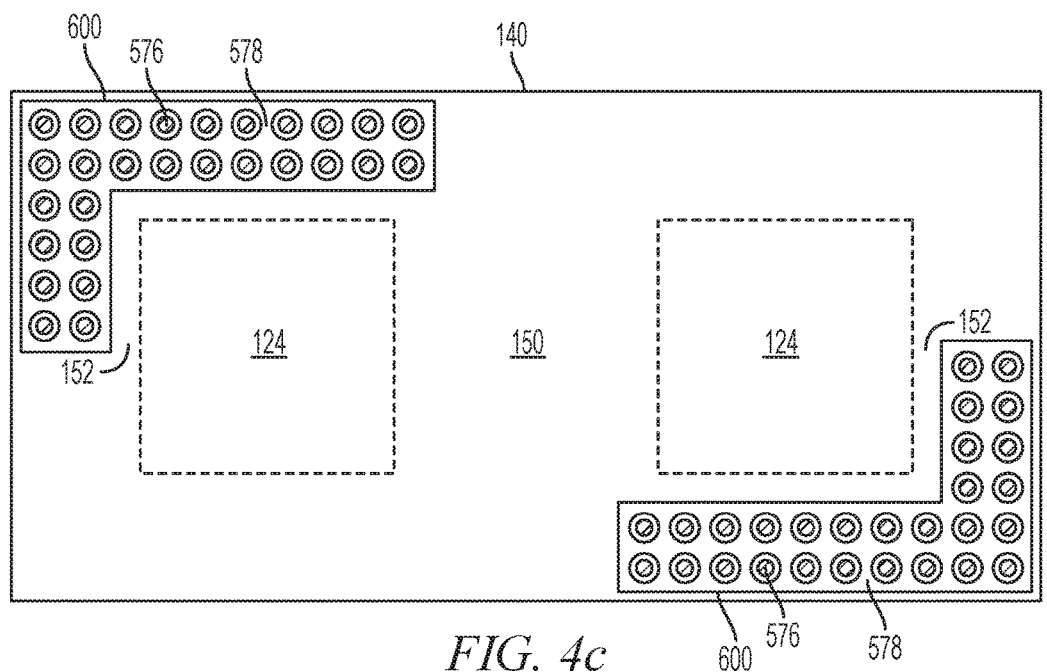
FIGS. 4a-4n illustrate a process of forming a low profile fan-out package-on-package structure with 3D vertical interconnection units.
Figure 4D:
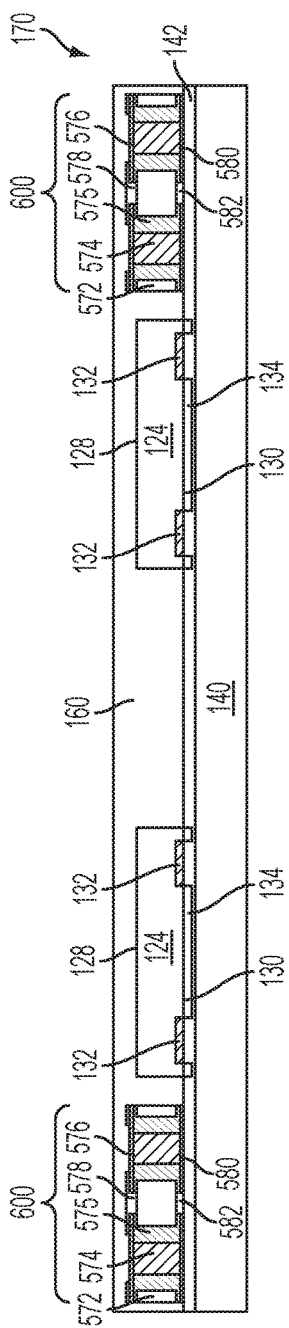
Figure 4E:
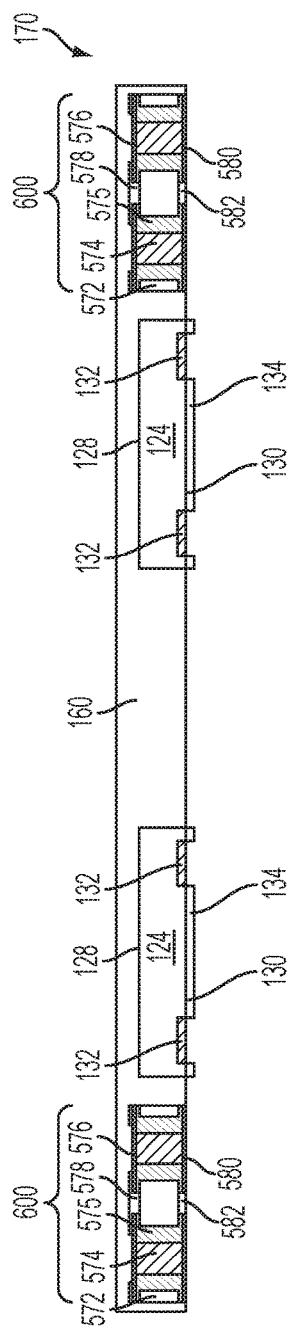
Figure 4F:
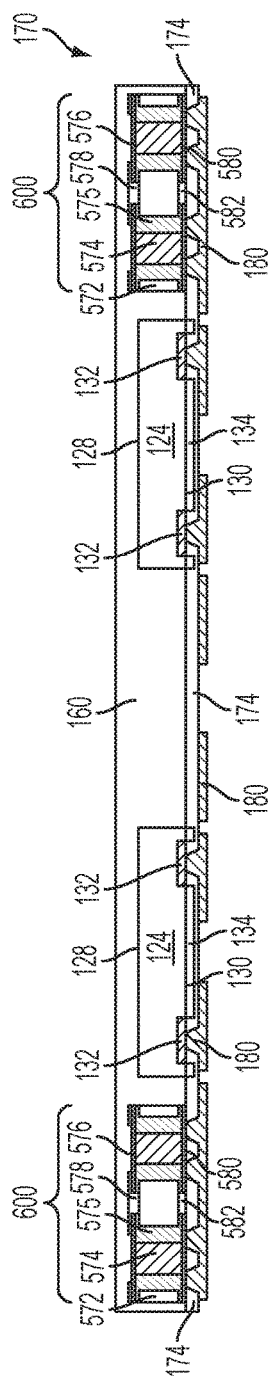
Figure 4L:
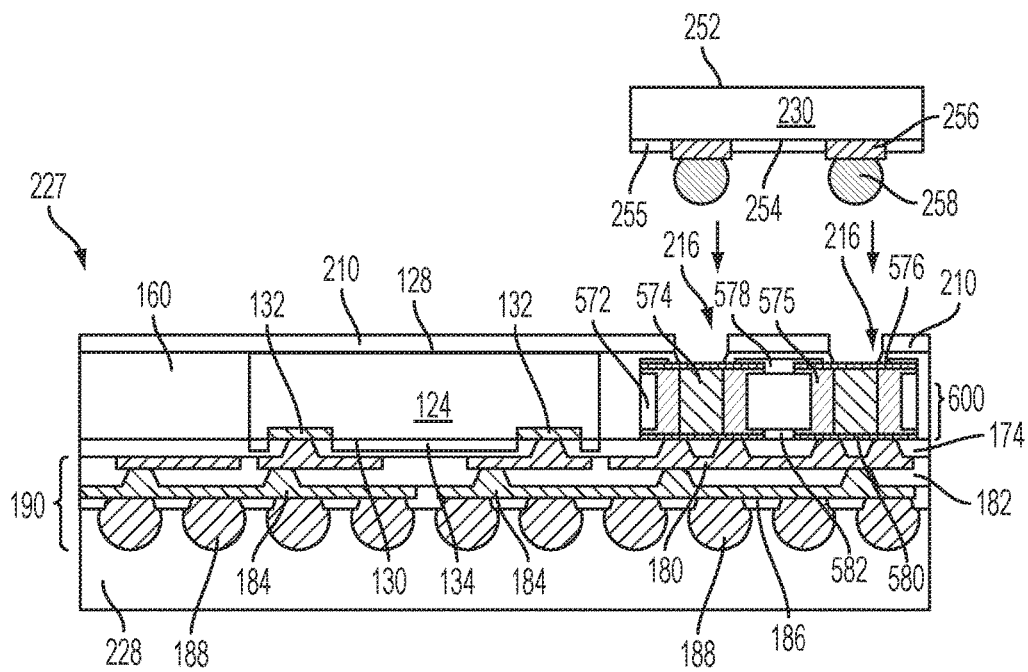
Figure 4M:
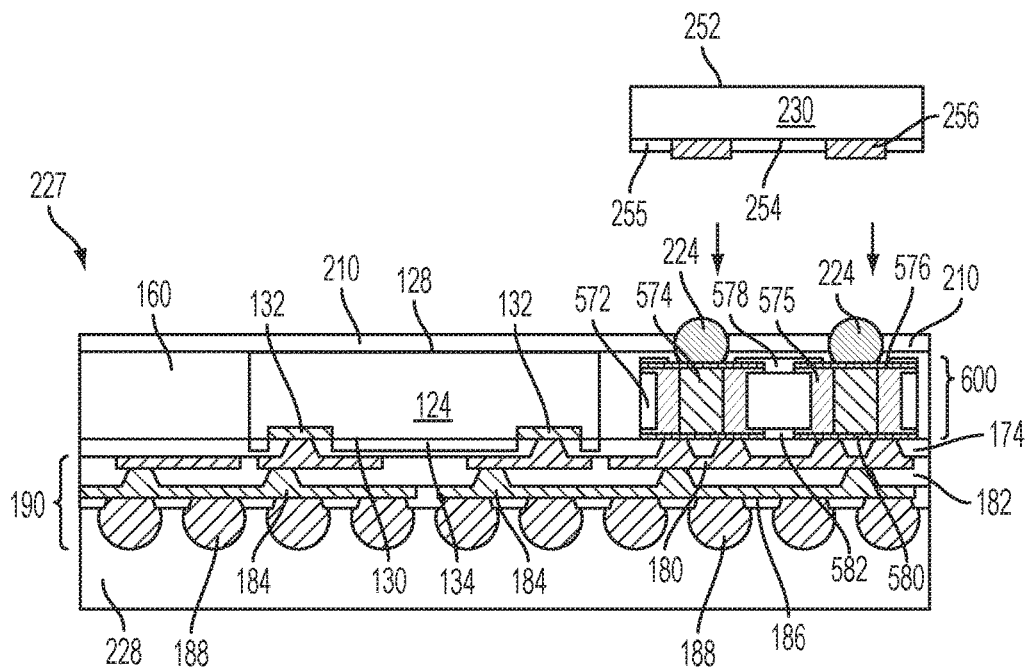
Figure 4N:
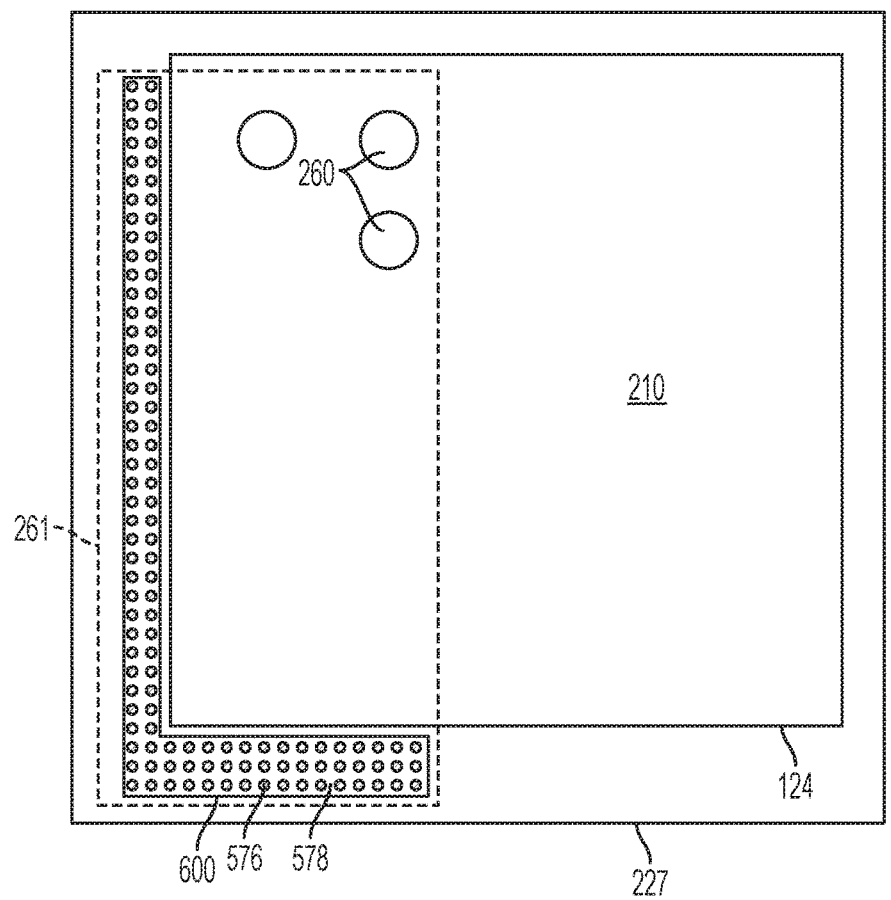

FIGS. 4a-4n illustrate, in relation to FIGS. 1 and 2a-2c, a process of forming a low profile 3D semiconductor package structure using prefabricated modular interconnection units. FIG. 4a shows a cross-sectional view of a portion of a carrier or temporary substrate 140 containing sacrificial base material such as silicon, polymer, beryllium oxide, glass, or other suitable low-cost, rigid material for structural support. An interface layer or double-sided tape 142 is formed over carrier 140 as a temporary adhesive bonding film, etch-stop layer, or thermal release layer.

Carrier 140 can be a round or rectangular panel (greater than 300 mm) with capacity for multiple semiconductor die 124. Carrier 140 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 140 is selected independent of the size of semiconductor die 124 or size of semiconductor wafer 120. That is, carrier 140 has a fixed or standardized size, which can accommodate various size semiconductor die 124 singulated from one or more semiconductor wafers 120. In one embodiment, carrier 140 is circular with a diameter of 330 mm. In another embodiment, carrier 140 is rectangular with a width of 560 mm and length of 600 mm. Semiconductor die 124 may have dimensions of 10 mm by 10 mm, which are placed on the standardized carrier 140. Alternatively, semiconductor die 124 may have dimensions of 20 mm by 20 mm, which are placed on the same standardized carrier 140. Accordingly, standardized carrier 140 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 140 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

In FIG. 4b, semiconductor die 124 from FIG. 3c are mounted to die attach area 150 of carrier 140 using, for example, a pick and place operation with active surface 130 oriented toward the carrier. The semiconductor die 124 mounted to die attach area 150 may be chosen from KGD. Semiconductor die 124 are pressed into interface layer 142 such that a portion of insulating layer 134 is disposed within and surrounded by the interface layer.

FIG. 4b also shows pre-fabricating modular 3D interconnection units 600 including core substrate 572 with a plurality of through conductive vias 574-575 is formed through the core substrate. An electrically conductive layer or RDL 576 is formed over core substrate 572 and conductive vias 574-575 using a patterning and metal deposition process such as printing, PVD, CVD, sputtering, electrolytic plating, and electroless plating. Conductive layer 576 includes one or more layers of Al, Cu, Sn, Ni, Au, Ag, or other suitable electrically conductive material. Conductive layer 576 is electrically connected to conductive vias 574-575.

An insulating or passivation layer 578 is formed over core substrate 572 and conductive layer 576 using PVD, CVD, printing, spin coating, spray coating, slit coating, rolling coating, lamination, sintering or thermal oxidation. Insulating layer 578 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 578 is removed by LDA, etching, or other suitable process to expose portions of conductive layer 576 over conductive vias 574.

An insulating or passivation layer 582 is formed over core substrate 572 using PVD, CVD, printing, spin coating, spray coating, slit coating, rolling coating, lamination, sintering or thermal oxidation. The insulating layer 582 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulation layer 582 is removed by LDA or etching to expose portions of conductive vias 574-575.

An electrically conductive layer or RDL 580 is formed over core substrate 572 and conductive vias 574 opposite conductive layer 576 using a patterning and metal deposition process such as printing, PVD, CVD, sputtering, electrolytic plating, and electroless plating. Conductive layer 580 includes one or more layers of Al, Cu, Sn, Ni, Au, Ag, Ti, W, or other suitable electrically conductive material. Conductive layer 580 is electrically connected to conductive vias 574. Alternatively, conductive vias 574 are formed through core substrate 572 after forming conductive layer 576 and conductive layer 580.

Modular interconnection units 600 are mounted to carrier 140 using, for example, a pick and place operation with an optional adhesive. Interconnection units 600 are disposed on interface layer 142 in a peripheral region of semiconductor die 124. Interconnection units 600 are disposed in an L-shaped arrangement over carrier 140 around a corner of die attach area 150 and at least partially along a length of two sides of semiconductor die 124, as shown in FIG. 4c. Interconnection units 600 may be clustered together to form a continuous layer of interconnection units, or disposed over isolated and predetermined portions over carrier 140. In some embodiments, semiconductor die 124 is mounted to carrier 140 before mounting interconnection units 600.

Alternatively, interconnection units 600 are mounted to carrier 140 before mounting semiconductor die 124. Semiconductor die 124 and interconnection units 600 can be simultaneously mounted to carrier 140.

Interconnection units 600 are a modular vertical interconnect component that are easily disposed within a semiconductor package to form a border, slot, or frame over or around a side portion of semiconductor die 124. Modular interconnection units 600 are disposed around semiconductor die 124 to provide vertical interconnect while reducing the number or quantity of RDLs formed within the semiconductor package. For example, interconnection units 600 provide partial backside RDL with improved efficiency during manufacturing steps. Interconnection units 600 disposed around semiconductor die 124 also provide structural support during packaging and reduce shifting during the application of encapsulant and additional semiconductor components. Interconnection units 600 extend design flexibility and reduce z-direction package height while providing valuable vertical interconnect. As individual modular units, interconnection units 600 are disposed within the semiconductor package at specific predetermined locations around semiconductor die 124 to optimize the space within the semiconductor package. Using interconnection units 600 reduces manufacturing steps, and greatly increases flexibility of semiconductor package design.

In some embodiments, interconnection units 600 have a height greater than a height or thickness of semiconductor die 124. In other embodiments, interconnection units 600 have a height equal to or less than a height or thickness of the semiconductor die. When mounting interconnection units adjacent to semiconductor die 124, a gap or space 152 may remain around die attach area 150 between die attach area 150 and interconnection units 600. Alternatively, die attach area 150 is allocated such that semiconductor die 124 abut or contact interconnection units 600.

FIG. 4d shows composite substrate or reconstituted wafer 170 with encapsulant 160 deposited over semiconductor die 124 and interconnection units 600. Reconstituted wafer 170 can be processed into many types of semiconductor packages, including three dimensional (3D) packages, such as package-on-package (PoP), embedded wafer level ball grid array (eWLB), fan-in wafer level chip scale packages (WLCSP), reconstituted or embedded wafer level chip scale packages (eWLCSP), fan-out WLCSP, flipchip packages, or other semiconductor packages. Reconstituted wafer 170 is configured according to the specifications of the resulting semiconductor package. The distance between semiconductor die 124 on carrier 140 is optimized for manufacturing the semiconductor packages at the lowest unit cost. The larger surface area of carrier 140 accommodates more semiconductor die 124 and lowers manufacturing cost as more semiconductor die 124 are processed per reconstituted wafer 170. The number of semiconductor die 124 mounted to carrier 140 can be greater than the number of semiconductor die 124 singulated from semiconductor wafer 120. Carrier 140 and reconstituted wafer 170 provide the flexibility to manufacture many different types of semiconductor packages using different size semiconductor die 124 from different sized semiconductor wafers 120.

Encapsulant or molding compound 160 is deposited over semiconductor die 124 and interconnection units 600, using compressive molding, transfer molding, liquid encapsulant molding, vacuum lamination, spin coating, or other suitable applicator. Alternatively, encapsulant 160 can be formed over reconstituted wafer 170 in a chase mold. Encapsulant 160 can be polymer composite material, such as epoxy resin with filler, epoxy acrylate with filler, or polymer with proper filler. Encapsulant 160 is non-conductive and environmentally protects the semiconductor device from external elements and contaminants. Prior to depositing encapsulant 160, reconstituted wafer 170 may undergo a high pressure annealing process. Encapsulant 160 is formed over back surface 128 of semiconductor die 124, and can be thinned in a subsequent backgrinding step. Encapsulant 160 can also be deposited such that the encapsulant is coplanar with back surface 128. Interconnection units 600 around semiconductor die 124 reduce shifting of semiconductor die 124 during encapsulation and provide structural support during packaging.

In FIG. 4e, carrier 140 and interface layer 142 are removed from reconstituted wafer 170 by chemical etching, mechanical peeling, CMP, mechanical grinding, thermal bake, UV light, laser scanning, or wet stripping to expose conductive layer 132, interconnection units 600, and encapsulant 160. An optional cleaning process such as a laser clean, dry plasma, or wet development may also be used.

In FIG. 4f, an insulating or passivation layer 174 is formed over semiconductor die 124, encapsulant 160, and interconnection units 600 using PVD, CVD, printing, spin coating, spray coating, sintering, thermal oxidation, or other suitable process. The insulating layer 174 contains one or more layers of SiO2, Si3N4, SiON, Ta2O5, Al2O3, low temperature (less than 260° C.) curable polymer dielectric resist with or without filler, or other material having similar insulating and structural properties. A portion of insulating layer 174 is removed by LDA, etching, or other suitable process to expose conductive layer 132 of semiconductor die 124 and interconnection units 600 for subsequent electrical interconnect.

An electrically conductive layer 180 is formed over insulating layer 174, semiconductor die 124, and interconnection units 600 using PVD, CVD, electrolytic plating, electroless plating, or other metal deposition suitable process. Conductive layer 180 contains one or more layers of Al, Cu, Sn, Ni, Au, Ag, or other suitable electrically conductive material. Conductive layer 180 is electrically connected to conductive layer 132 and conductive vias 574. Portions of conductive layer 180 can be electrically common or electrically isolated depending on the design and function of semiconductor die 124 and operate as an RDL to fan-out and extend electrical connection from the semiconductor die to interconnection units 600.

In FIG. 4g, an insulating or passivation layer 182 is formed over insulating layer 174 and conductive layer 180 using PVD, CVD, printing, spin coating, spray coating, sintering, thermal oxidation, or other suitable process. The insulating layer 182 contains one or more layers of SiO2, Si3N4, SiON, Ta2O5, Al2O3, low temperature (less than 260° C.) curable polymer dielectric resist with or without filler, or other material having similar insulating and structural properties. A portion of insulating layer 182 is removed by LDA, etching, or other suitable process to expose conductive layer 180 for subsequent electrical interconnection.

An electrically conductive layer 184 is formed over conductive layer 180 and insulating layer 182 using PVD, CVD, electrolytic plating, electroless plating, or other metal deposition suitable process. Conductive layer 184 contains one or more layers of Al, Cu, Sn, Ni, Au, Ag, or other suitable electrically conductive material. Conductive layer 184 is electrically connected to conductive layer 180. Portions of conductive layer 184 can be electrically common or electrically isolated depending on the design and function of semiconductor die 124.

In FIG. 4h, an insulating or passivation layer 186 is formed over insulating layer 182 and conductive layer 184 using PVD, CVD, printing, spin coating, spray coating, sintering, thermal oxidation, or other suitable process. The insulating layer 186 contains one or more layers of SiO2, Si3N4, SiON, Ta2O5, Al2O3, low temperature (less than 260° C.) curable polymer dielectric resist with or without filler, or other material having similar insulating and structural properties. A portion of insulating layer 186 is removed by LDA, etching, or other suitable process to expose conductive layer 184 for subsequent electrical interconnect.

FIG. 4h further shows an electrically conductive bump material is deposited over conductive layer 184 and within the openings in insulating layer 186 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 184 using a suitable attachment or bonding process. In one embodiment, the bump material is reflowed by heating the material above its melting point to form balls or bumps 188. In some applications, bumps 188 are reflowed a second time to improve electrical contact to conductive layer 184. In one embodiment, bumps 188 are formed over an under bump metallization (UBM) having a wetting layer, barrier layer, and adhesive layer. The bumps can also be compression bonded to conductive layer 184. Bumps 188 represent one type of interconnect structure that can be formed over conductive layer 184. The interconnect structure can also use conductive paste, stud bump, micro bump, or other electrical interconnect. In some embodiments, bumps 188 are formed after a second semiconductor component is disposed over semiconductor die 124.

Taken together, insulating layers 174, 182, and 186 as well as conductive layers 180, 184, and bumps 188 form interconnect structure 190. The number of insulating and conductive layers included within interconnect structure 190 depends on, and varies with, the complexity of the circuit routing design. Accordingly, interconnect structure 190 can include any number of insulating and conductive layers to facilitate electrical interconnect with respect to semiconductor die 124. Elements that would otherwise be included in a backside interconnect structure or RDL can be integrated as part of interconnect structure 190 to simplify manufacturing and reduce fabrication costs with respect to a package including both front side and backside interconnects or RDLs.

In FIG. 4i, an optional carrier or temporary substrate 202 similar to carrier 140 is disposed over interconnect structure 190. Carrier 202 may be a backgrinding tape, supporting tape, and other carriers containing sacrificial base material such as silicon, polymer, beryllium oxide, glass, or other suitable low-cost, rigid material for structural support. Carrier 202 can include an interface layer, such as a double-sided tape, configured to receive interconnect structure 190. Carrier 202 optionally provides additional support for subsequent processing steps of a semiconductor package, as shown in FIGS. 4i-4n. Alternatively, the subsequent processing steps are performed without carrier 202.

FIG. 4i further shows top surface of encapsulant 160 opposite bumps 188 in a grinding operation with grinder 206 to planarize the surface and reduce a thickness of the encapsulant 160. A chemical etch or CMP process can also be used to remove mechanical damage and planarize encapsulant 160 with back surface 128. In one embodiment, after removal of a portion of encapsulant 160, encapsulant 160 has a thickness in a range of 100 to 400 μm. The grinding operation removes a portion of encapsulant 160 down to back surface 128 of semiconductor die 124. Alternatively, a layer of encapsulant 160 remains over back surface 128 of semiconductor die 124. In some embodiments, grinding operation exposes conductive layer 576 and may expose conductive material 574 of interconnection units 600. Alternatively, a portion of encapsulant 160 remains over interconnection units 600.

In FIG. 4j, an insulating layer, polymer matrix composite film, or warpage balance layer 210 is formed over back surface 128 of semiconductor die 124, encapsulant 160, and interconnection units 600. Insulating layer 210 includes an epoxy, resin, or polymer with a reinforcement fiber or fabric, such as phenolic cotton paper, epoxy, resin, woven glass, matte glass, polyester, and other reinforcement fibers or fabrics. In another embodiment, insulating layer 210 contains a molding compound, polymer dielectric with or without fillers, one or more layers of SiO2, Si3N4, SiON, Ta2O5, Al2O3, polymer matrix enhanced with woven glass fiber, or other material having similar insulating and structural properties. In yet another embodiment, insulating layer 210 includes one or more laminated layers of prepreg, FR epoxy-4, FR-1, CEM-1, or CEM-3. Insulating layer 210 is deposited using vacuum or pressure lamination with or without heat, PVD, CVD, screen printing, spin coating, spray coating, injection coating, sintering, thermal oxidation, or other suitable process. The insulating layer 210 is selected to have a coefficient of thermal expansion (CTE) similar to a CTE of Cu, i.e., within 10 ppm/° C. of the CTE of Cu. The material selected for insulating layer 210, such as prepreg, enhances the overall strength of the semiconductor package and improves package warpage, particularly at temperatures of 150° C. to 260° C. Insulating layer 210 balances warpage across the semiconductor device and provides additional support during subsequent device integration. Insulating layer 210 also protects exposed portions of the semiconductor die 124. In some embodiments, semiconductor die 124 is completely embedded by insulating layer 210, encapsulant 160, and interconnect structure 190.

In FIG. 4k, a portion of insulating layer 210 and encapsulant 160 is removed by LDA, etching, or other suitable process to form vias or openings 216 through insulating layer 210 and encapsulant 160 to expose conductive vias 574 of interconnection units 600. In some embodiments, formation of vias 216 further includes the removal of a portion of insulating layer 578.

In some embodiments, after formation of vias 216, an electrically conductive bump material is deposited in vias 216 and over interconnection units 600 using an evaporation, electrolytic plating, electroless plating, ball drop, screen printing, paste printing, jetting, or other suitable process. The bump material can be Al, Sn, Ni, Au, Ag, Pb, Bi, Cu, solder, and combinations thereof, with an optional flux solution. The flux solution is spin coated, stencil printed, or applied in a dipping process. The flux solution is non-clean flux with solvent, or a water clean flux. The bump material can be eutectic Sn/Pb, high-lead solder, or lead-free solder. The bump material is bonded to interconnection units 600 using a suitable attachment or bonding process. In some embodiments, bump material is bonded to a solder cap formed on conductive layer 576. In one embodiment, the bump material is reflowed by heating the material above its melting point to form balls or bumps 224, as shown in FIG. 4m. In some applications, bumps 224 are reflowed a second time to improve electrical contact to interconnection units

600. Bumps 224 can be reflowed with or without support from carrier 202 and with support from a separate carrier. In one embodiment, bumps 224 are formed over a UBM having a wetting layer, barrier layer, and adhesive layer. Bumps 224 can also be compression bonded to interconnection units 600. Bumps 224 represent one type of interconnect structure that can be formed over interconnection units 600. The interconnect structure can also use conductive paste, stud bump, micro bump, solder balls with a Cu core, Cu balls or columns with dipped solder paste or solder coating, or other electrical interconnect disposed within vias 216.

Bumps 224 together with interconnect structure 190, interconnection units 600, and semiconductor die 124 form a 3D interconnection for next level interconnect. In one embodiment, bumps 224 are formed by surface mount technology (SMT) with paste printing deposited into vias 216 at the reconstituted wafer level. After the formation of bumps 224, an optional polymer dielectric paste plugging may be applied over and around the bumps to provide additional support. The polymer dielectric paste plugging is applied through printing, spray coating, dipping, jetting, or other suitable process and is followed by an optional reflow or heat treatment under vacuum. Alternatively, bumps are later formed on an external semiconductor package, as shown in FIG. 4l.

FIG. 4k further shows composite substrate or reconstituted wafer 170 is singulated using a saw blade or laser cutting tool 226 into individual semiconductor packages 227. By singulating reconstituted wafer 170 before mounting additional semiconductor devices over the reconstituted wafer 170, the formation of a semiconductor package is accomplished by mounting additional semiconductor devices to individual semiconductor packages 227 rather than at the reconstituted wafer level. Alternatively, reconstituted wafer 170 is singulated after additional semiconductor devices are mounted to the reconstituted wafer 170. Semiconductor packages 227 may undergo electrical testing before or after singulation.

After singulating the semiconductor device into individual semiconductor packages 227 and removing carrier 202, an optional carrier, carrier tray, or temporary substrate 228 is disposed over interconnect structure 190, as shown in FIG. 4l. Alternatively, carrier 202 is singulated along with reconstituted wafer 170. Carrier 228 includes a backgrinding tape, supporting tape, and other carriers containing sacrificial base material such as silicon, polymer, beryllium oxide, glass, or other suitable low-cost, rigid material for structural support. Carrier 228 can include an interface layer, double-sided tape, and openings configured to receive composite substrate 170 or semiconductor packages 227 and interconnect structure 190. Carrier 228 optionally provides additional support for subsequent processing steps of the semiconductor package, as shown in FIGS. 4l-4n. Alternatively, the subsequent processing steps are performed without carrier 228.

FIG. 4l further shows semiconductor package, semiconductor die, or semiconductor component 230, singulated from a semiconductor wafer similar to FIGS. 3a-3c, with a back surface 252 and active surface 254 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 254 to implement analog circuits or digital circuits, such as a DSP, ASIC, memory, or other signal processing circuit. Semiconductor die 230 may also contain IPDs, such as inductors, capacitors, and resistors, for RF signal processing. Semiconductor die 230 undergo electrical testing before or after singulation from a semiconductor wafer similar to semiconductor die 124 of FIGS. 3a-3c.

An insulating or passivation layer 255 is formed over semiconductor die 230 using PVD, CVD, printing, spin coating, spray coating, sintering, thermal oxidation, or other suitable process. The insulating layer 255 contains one or more layers of $SiO_2$, $Si_3N_4$, SiON, $Ta_2O_5$, $Al_2O_3$, or other material having similar insulating and structural properties. A portion of insulating layer 255 is removed by LDA, etching, or other suitable process for subsequent electrical interconnect.

An electrically conductive layer 256 is formed over active surface 254 using PVD, CVD, electrolytic plating, electroless plating process, or other suitable metal deposition process. Conductive layer 256 can be one or more layers of Al, Cu, Sn, Ni, Au, Ag, or other suitable electrically conductive material. Conductive layer 256 operates as contact pads 256 electrically connected to the circuits on active surface 254. Conductive layer 256 can be formed as contact pads 256 disposed side-by-side a first distance from the edge of semiconductor die 230. Alternatively, conductive layer 256 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over conductive layer 256 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 256 using a suitable attachment or bonding process. In some embodiments, the bump material is reflowed by heating the material above its melting point to form balls or bumps 258. In some applications, bumps 258 are reflowed a second time to improve electrical contact to conductive layer 256. In some embodiments, bumps 258 are formed over a UBM having a wetting layer, barrier layer, and adhesive layer. The bumps can also be compression bonded or thermocompression bonded to conductive layer 256. Bumps 258 represent one type of interconnect structure that can be formed over conductive layer 256. The interconnect structure can also use conductive paste, stud bump, micro bump, or other electrical interconnect.

In some embodiments, bumps 258 form part of a BGA formed over conductive layer 256. The BGA is formed such that bumps 258 align with the orientation of vias 216 over interconnection units 600. Alternatively, a first portion of bumps 258 align with vias 216 over interconnection units 600 and a second portion of bumps 258 are isolated from interconnection units 600 or form part of additional interconnect structures around semiconductor die 230.

Using a pick and place operation, semiconductor die 230 is mounted to individual semiconductor package 227 with active surface 254 oriented toward vias 216 and bumps 258 extending into vias 216 to contact interconnection units 600. As previously discussed, bumps 224 may be pre-formed within vias 216 prior to stack assembly (FIG. 4m). In some embodiments, semiconductor die 230 has a width that is larger than a width of semiconductor die 124. Semiconductor die 230 can be located outside or partially outside a footprint of semiconductor die 124 after semiconductor die 230 has been mounted to semiconductor package 227. In some embodiments, an interconnect structure is formed over active surface 254 of semiconductor die 230 and bumps 258 are formed over a surface of the interconnect structure. In other embodiments, semiconductor die 230 does not have bumps 258 and semiconductor die 230 connects with individual semiconductor package 227 at interconnection units 600 through bumps 224 preformed in vias 216, as shown in FIG. 4m. In another embodiment, semiconductor die 230 connects with individual semiconductor package 227 at interconnection units 600 through the combination of bumps 258 and an interconnect structure, or through an interconnect structure without bumps 258. The formation of bumps 258 can be conducted just before or during mounting of semiconductor die 230 to individual semiconductor package 227.

Before mounting semiconductor die 230 over individual semiconductor package 227, an underfill material 260, epoxy-resin adhesive material, epoxy compound, or molding material is disposed over insulating layer 210 within a footprint of semiconductor package 227, as shown in FIG. 4n. Dotted line 261 indicates a die attach area for semiconductor die 230. Underfill material 260 is applied by balance position as dots disposed over insulating layer 210 within a footprint of individual semiconductor package 227. Underfill material 260 supports semiconductor die 230 during stack assembly and mounting of semiconductor die 230 over individual semiconductor package 227. Alternatively, or in combination with underfill material 260, a non-conductive paste is disposed over insulating layer 210 to provide additional support during stack assembly and mounting of semiconductor die 230 over individual semiconductor package 227. Underfill material 260 provides support during mounting and during a subsequent reflow process. Underfill material 260 may optionally be disposed on active surface 254 of semiconductor die 230.

In some embodiments, bumps 258 form part of an interconnect structure disposed over active surface 254 of semiconductor die 230 to facilitate rerouting of semiconductor die 230, similar to interconnect structure 190. Bumps 258 can extend from an interconnect structure such that the interconnect structure, bumps 258, interconnect structure 190, and interconnection units 600 make up an L-shaped interconnect formed from semiconductor package 227 to semiconductor die 230.

Carrier 228 is removed after or during stack assembly by chemical etching, mechanical peeling, CMP, mechanical grinding, thermal bake, UV light, laser scanning, or wet stripping. An optional encapsulant may be deposited over semiconductor package 227 and semiconductor die 230.

Figure 5:
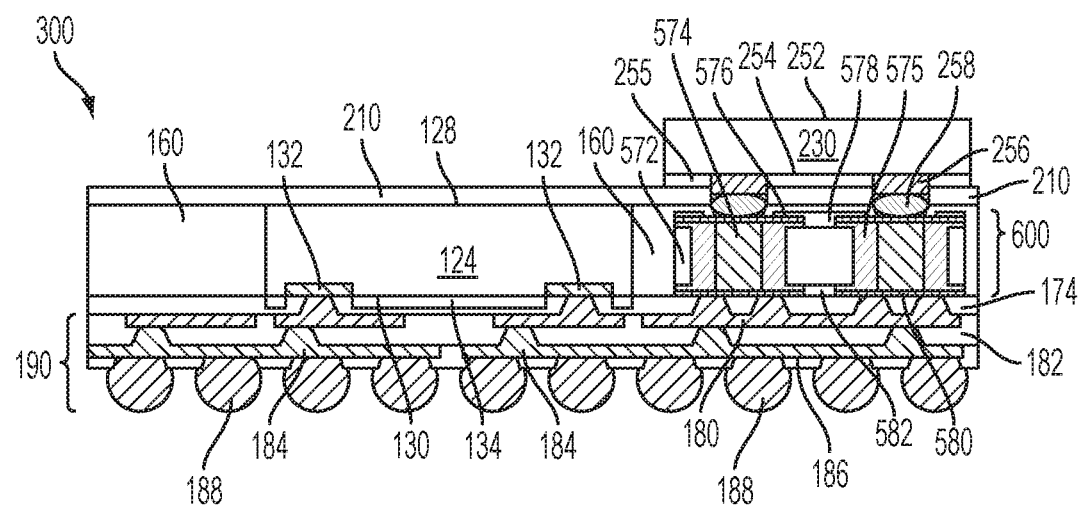
FIG. 5 illustrates a robust semiconductor package with interconnection units.

FIG. 5 shows semiconductor package 300 formed using the process illustrated in FIGS. 4a-4n after separation from carrier 228 with semiconductor die 230 and bumps 258 mounted over semiconductor die 124. In some embodiments, semiconductor die 230 is laterally offset over semiconductor die 124 such that semiconductor die 230 is disposed over a portion of semiconductor die 124. Interconnection units 600 are disposed within semiconductor package 300, perpendicular to interconnect structure 190, and extend vertically over interconnect structure 190. In some embodiments, a height of bumps 258 combined with interconnection units 600 is greater than a thickness of semiconductor die 124. Thus, a gap exists between active surface 254 and back surface 128. Insulating layer 210 is interposed in the gap between active surface 254 and back surface 128. Alternatively, a height of bumps 258 combined with interconnection units 600 is equal to or less than a thickness of semiconductor die 124. Active surface 254 of semiconductor die 230 may rest on insulating layer 210 over back surface 128 with no gap between active surface 254 and back surface 128. Insulating layer 210 formed over back surface 128 and encapsulant 160 and interposed between active surface 254 and back surface 128 provides physical support, controls overall package warpage, and environmentally protects semiconductor die 124 from external elements and contaminants. Insulating layer 210 provides structural support for semiconductor package 300, balances stress on the package, and reduces warping or cracking of package 300 during subsequent handling and processing.

Semiconductor package 300 provides 3D vertical electrical interconnection through a combination of interconnect structure 190, interconnection units 600, and bumps 258. The vertical interconnection is formed with reduced backside RDL. Interconnect structure 190 is formed over active surface 130 of semiconductor die 124 and over encapsulant 160 with a portion of interconnect structure 190 around the periphery of the semiconductor die 124. Interconnect structure 190 includes insulation and conductive layers that form a fan-out interconnect structure and includes elements that would otherwise be included in a backside RDL or interconnect structure. Interconnection units 600 provide vertical interconnect to reduce RDL layers, and provide a partial backside RDL without the cost and more difficult manufacturing processes associated with forming a complete RDL layer or multiple RDLs over a backside of semiconductor package 300. Using interconnection units 600 within semiconductor package 300 provides design flexibility and reduces the height of semiconductor package 300. Semiconductor package 300 is a low profile 3D package structure.

Using prefabricated modular interconnection units 600 provides additional flexibility during packaging because interconnection units 600 can be mounted to carrier 140 or semiconductor package 300 at various stages of the packaging process. Mounting interconnection units 600 using an adhesive does not require formation of layers over a carrier 140 during packaging of semiconductor package 300. Interconnection units 600 are modular units that can be disposed within or removed from a semiconductor package such as semiconductor package 300, unlike layers formed within a semiconductor package. Interconnection units 600 disposed around semiconductor die 124 provide vertical interconnect with reduced RDL application. Interconnection units 600 formed around semiconductor die 124 provide structural support during packaging and reduce shifting during the application of encapsulant 160 and external semiconductor components such as semiconductor die 230. In some embodiments, a continuous vertical interconnect along a vertical plane is made from conductive layer 256, through bumps 258, interconnection units 600, conductive layer 180, conductive layer 184, to bumps 188. True 3D interconnection is achieved with semiconductor package 300 while reducing the height of semiconductor package 300. As vertical structures, interconnection units 600 can form a border, frame, slot, or other similar support structure around a side portion or peripheral region of semiconductor die 124 in addition to providing vertical electrical interconnect. Interconnection units 600 reduce the quantity of RDLs formed within a package. Interconnection units 600 provide partial backside RDL without the cost, time, and other manufacturing restraints associated with forming multiple RDLs in a semiconductor package. Interconnection units 600 provide design flexibility while reducing z-direction package height.

Bumps 258, or interconnect structures of an external device such as semiconductor die 230, can be disposed or formed on semiconductor die 230 in an orientation matching the layout or orientation of interconnection units 600 disposed around semiconductor die 124. Matching bumps 258 or interconnect structures of semiconductor die 230 with the layout of interconnection units 600 reduces manufacturing materials and cost. Matching interconnection units 600 with bumps 258 or interconnect structures of semiconductor die 230 provides a consistent and reliable 3D vertical interconnect. In some embodiments, interconnect structure 190 further matches the orientation of interconnection units 600 around semiconductor die 124.

Creating vertical interconnect by disposing interconnection units 600 as opposed to build-up layers and RDLs provides enhanced flexibility for packaging design. Interconnection units 600 do not have to be disposed over an entire surface area and can be disposed as modular units at customized locations within a semiconductor package 300, which is difficult to accomplish with other interconnect structures. For example, disposing interconnection units 600 over first side portions of the semiconductor die 124 and not around second side portions of the semiconductor die 124 can free valuable space within semiconductor package 300 and expose the second side portions around semiconductor die 124 for additional electrical components. Alternatively, where increased vertical interconnect density is desired, interconnection units 600 can completely surround semiconductor die 124 for a dense yet flexible vertical interconnect. Interconnection units 600 conserve materials while optimizing the space within semiconductor package 300.

Figure 6A:
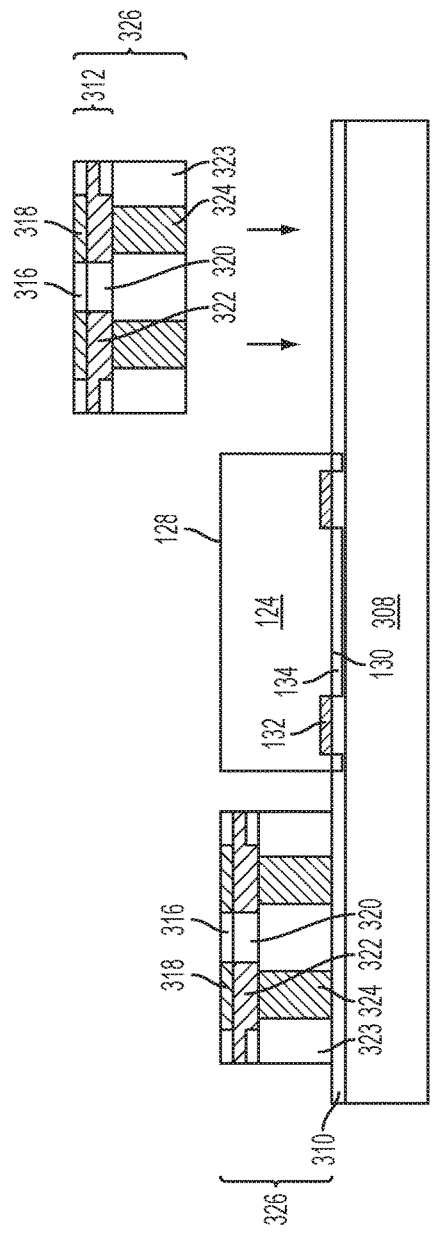

FIGS. 6a-6h illustrate a process flow for an alternative embodiment of a semiconductor package, formed with a process similar to the semiconductor package 300 in FIGS. 4a-4n. FIG. 6a shows a cross-sectional view of a portion of a carrier or temporary substrate 308, similar to carrier 140 of FIG. 4a, containing sacrificial base material such as silicon, polymer, beryllium oxide, glass, or other suitable low-cost, rigid material for structural support. An interface layer or double-sided tape 310 is formed over carrier 308 as a temporary adhesive bonding film, etch-stop layer, or thermal release layer.

FIG. 6a shows semiconductor die 124 from FIG. 3c mounted to interface layer 310 using, for example, a pick and place operation with active surface 130 oriented toward carrier 308. Semiconductor die 124 mounted to die attach area 150 can be chosen from KGD. Semiconductor die 124 are pressed into interface layer 310 such that a portion of insulating layer 134 is disposed within and surrounded by the interface layer.

Prefabricated modular interconnection units or interconnect structures 326, similar to interconnection units 600, are mounted to interface layer 310 with an optional adhesive. Similar to interconnection units 600, interconnection units 326 are prefabricated with a typical laminate substrate at the panel/strip level and singulated into individual interconnection units 326. Interconnection units 326 include interconnect layer 312, core substrate 323, and conductive vias 324. Interconnection units 326 are disposed a distance from the carrier edge, i.e., a gap or space remains between the carrier edge and interconnection units 326. Alternatively, interconnection units 326 extend to the edge of carrier 308. Interconnection units 326 are disposed a distance from semiconductor die 124, i.e., a gap or space remains between semiconductor die 124 and interconnection units 326.

Interconnect layer 312 includes a first insulating or passivation layer 316 over core substrate 323 containing one or more layers of SiO2, Si3N4, SiON, Ta2O5, Al2O3, or other material having similar insulating and structural properties. Insulating layer 316 is formed using PVD, CVD, printing, spin coating, spray coating, sintering or thermal oxidation.

Interconnect layer 312 includes a first electrically conductive layer 318 formed in insulating layer 316 using a patterning and metal deposition process such as PVD, CVD, sputtering, electrolytic plating, and electroless plating. Conductive layer 318 can be one or more layers of Al, Cu, Sn, Ni, Au, Ag, or other suitable electrically conductive material. Conductive layer 318 serves as a Cu pad for interconnection units 326.

Interconnect layer 312 further includes a second insulating or passivation layer 320 formed over conductive layer 318 and insulating layer 316 containing one or more layers of SiO2, Si3N4, SiON, Ta2O5, Al2O3, or other material having similar insulating and structural properties. Insulating layer 320 is formed using PVD, CVD, printing, spin coating, spray coating, sintering or thermal oxidation.

Interconnect layer 312 further includes a second electrically conductive layer 322 formed over insulating layer 320 and conductive layer 318 using a patterning and metal deposition process such as PVD, CVD, sputtering, electrolytic plating, and electroless plating. Conductive layer 322 can be one or more layers of Al, Cu, Sn, Ni, Au, Ag, or other suitable electrically conductive material. Conductive layer 322 is electrically connected to conductive layer 318 and conductive vias 324. Other portions of conductive layer 322 can be electrically common or electrically isolated depending on the design and function of the semiconductor device.

Figure 6B:
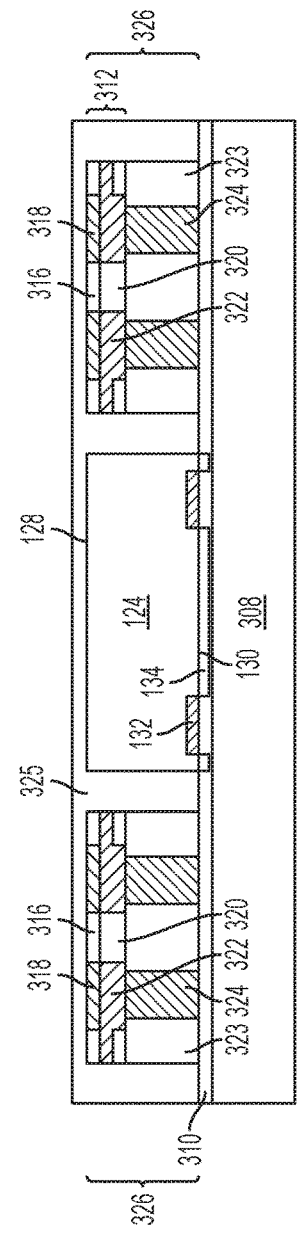

FIG. 6b shows interconnection units 326 mounted to interface layer 310 around semiconductor die 124. Interconnection units 326 are mounted on interface layer 310 over opposing sides of semiconductor die 124, as shown in FIG. 6c, with active surface 130 of semiconductor die 124 oriented toward interface layer 310 and interconnect layer 312 of interconnection units 326 opposite interface layer 310.

FIG. 6b further shows encapsulant or molding compound 325 deposited over semiconductor die 124, interconnection units 326, carrier 308, and interface layer 310 using a paste printing, compressive molding, transfer molding, liquid encapsulant molding, vacuum lamination, spin coating, or other suitable applicator. Alternatively, encapsulant 325 is applied using a chase mold. Encapsulant 325 can be polymer composite material, such as epoxy resin with filler, epoxy acrylate with filler, or polymer with proper filler. Encapsulant 325 is non-conductive and environmentally protects the semiconductor device from external elements and contaminants. Encapsulant 325 is formed over back surface 128 of semiconductor die 124, and can be thinned in a subsequent backgrinding step.

Figure 6C:
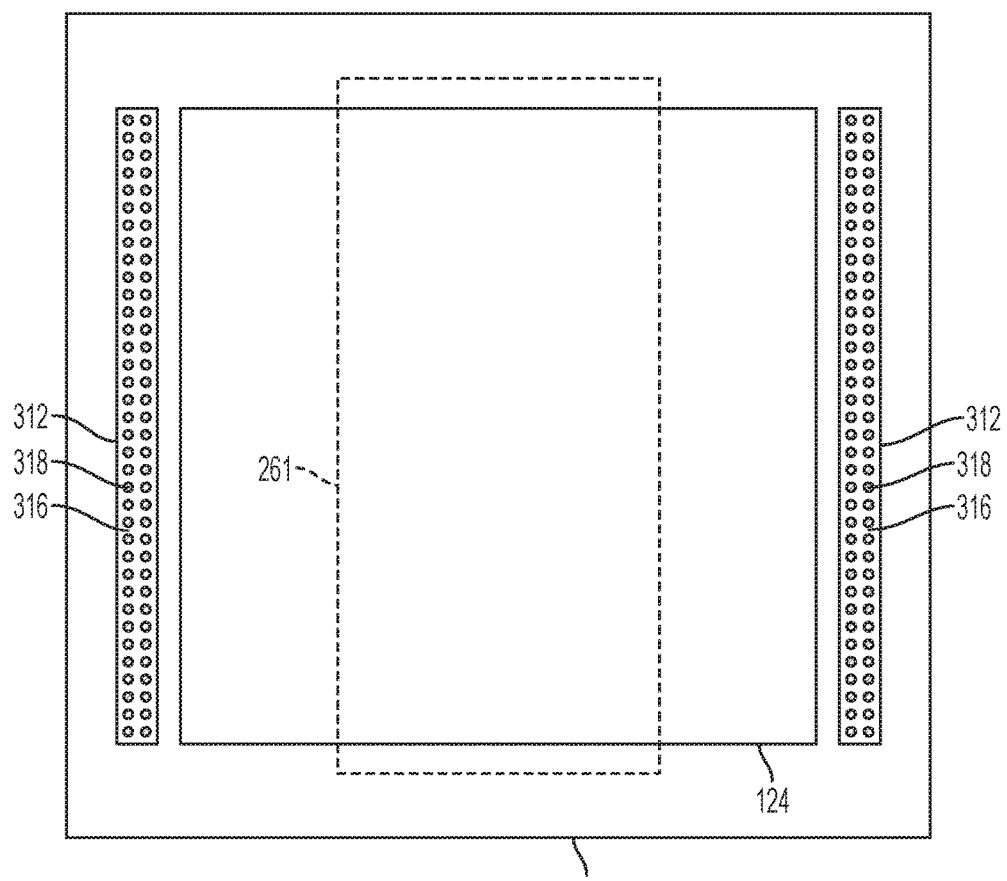

FIG. 6c shows a top view of the semiconductor package from FIG. 6b, before encapsulant 325, and after mounting interconnection units 326 to interface layer 310. In some embodiments, interconnection units 326 are disposed over opposing sides of semiconductor die 124. Dotted line 261 represents a die attach area for the later mounting of semiconductor die 230.

Figure 6D:
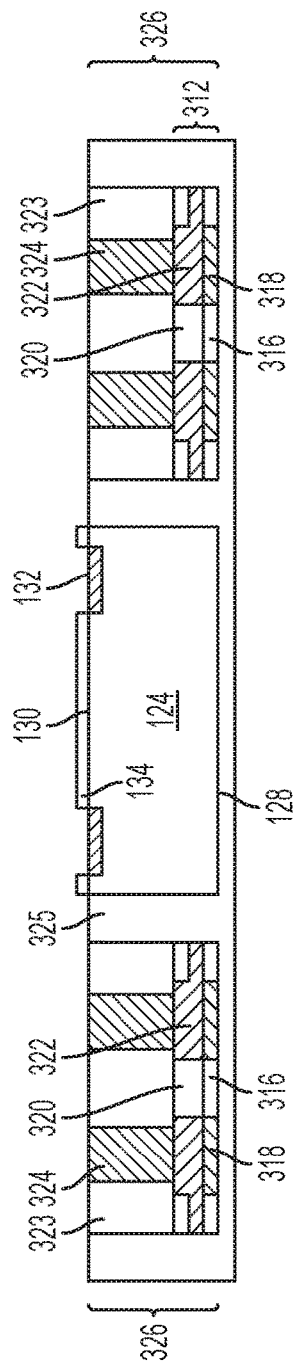

In FIG. 6d, carrier 308 and interface layer 310 are removed by chemical etching, mechanical peeling, chemical mechanical planarization CMP, mechanical grinding, thermal bake, UV light, laser scanning, or wet stripping. An optional cleaning process such as a laser clean, dry plasma, or wet development may also be used.

Figure 6E:
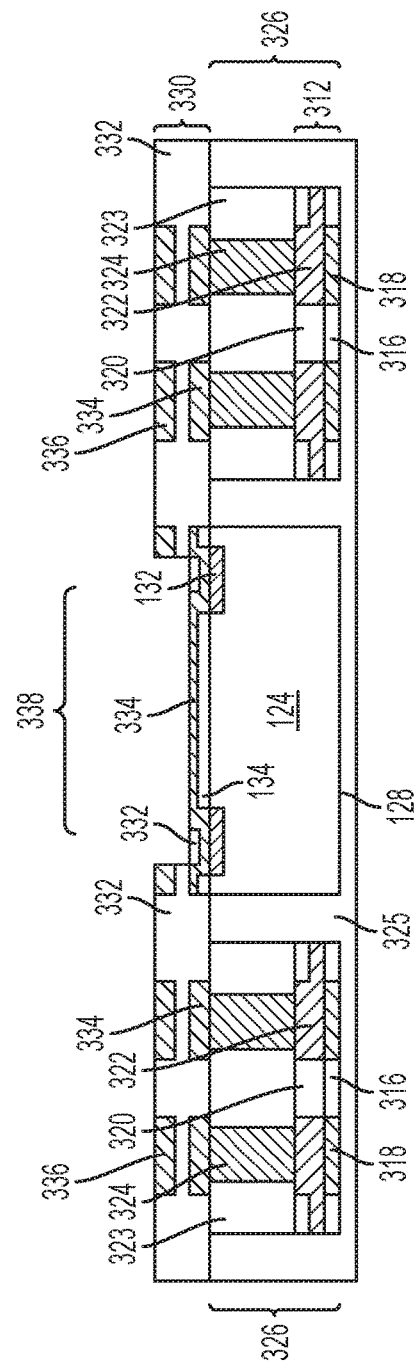

In FIG. 6e, an additional build-up interconnect structure 330 is formed over encapsulant 325, active surface 130, and interconnection units 326. Interconnect structure 330 includes a cavity 338 formed in interconnect structure 330 over semiconductor die 124. In some embodiments, cavity 338 is a die attach area. In some embodiments, cavity 338 exposes active surface 130 over the cavity for the subsequent mounting of semiconductor die 230 directly to semiconductor die 124. In some embodiments, as shown in FIG. 6e, a thinned portion of interconnect structure 330 remains over semiconductor die 124 such that active surface 130 is not exposed by cavity 338. During the formation of interconnect structure 330, insulating layer 327 may be either partially removed or fully removed by partial mechanical grinding or laser ablation.

Interconnect structure 330 includes an insulating or passivation layer 332 containing one or more layers of SiO2, Si3N4, SiON, Ta2O5, Al2O3, or other material having similar insulating and structural properties. Insulating layer 332 is formed using PVD, CVD, printing, spin coating, spray coating, sintering or thermal oxidation.

Interconnect structure 330 includes an electrically conductive layer 334 formed in insulating layer 332 using a patterning and metal deposition process such as PVD, CVD, sputtering, electrolytic plating, and electroless plating. Conductive layer 334 can be one or more layers of Al, Cu, Sn, Ni, Au, Ag, or other suitable electrically conductive material. In some embodiments, a portion of conductive layer 334 is electrically connected to interconnection units 326 and a portion of conductive layer 334 is electrically connected to conductive layer 132 over active surface 130. Other portions of conductive layer 334 can be electrically common or electrically isolated depending on the design and function of the semiconductor device.

Interconnect structure 330 further includes an electrically conductive layer 336 formed in insulating layer 332 and over conductive layer 334 using a patterning and metal deposition process such as PVD, CVD, sputtering, electrolytic plating, and electroless plating. Conductive layer 336 can be one or more layers of Al, Cu, Sn, Ni, Au, Ag, or other suitable electrically conductive material. In some embodiments, a portion of conductive layer 336 is electrically connected to conductive layer 334. Other portions of conductive layer 336 can be electrically common or electrically isolated depending on the design and function of the semiconductor device.

In FIG. 6f, a surface of encapsulant 325 opposite interconnect structure 330 undergoes a grinding operation with grinder 206 to planarize the surface and reduce a thickness of the encapsulant 325, exposing conductive layer 318. Alternatively, shallow LDA is used to expose conductive layer 318 of interconnection units 326 through encapsulant 325.

In FIG. 6g, a semiconductor package, semiconductor die, or semiconductor component 230, singulated from a semiconductor wafer similar to FIGS. 3a-3c, is disposed over cavity 338. Using a pick and place operation, semiconductor die 230 is mounted within cavity 338 of interconnect structure 330. Bumps 258 of semiconductor die 230 are bonded to conductive portions, such as conductive layer 334, of interconnect structure 330 within cavity 338 and over active surface 130 of semiconductor die 124. Alternatively, cavity 338 exposes active surface 130 and semiconductor die 230 connects directly with conductive layer 132 over active surface 130 through bumps 258. In some embodiments, semiconductor die 230 has a width that is less than a width of semiconductor die 124. In some embodiments, semiconductor die 230 is disposed over a footprint of semiconductor die 124. In some embodiments, semiconductor die 230 does not have bumps 258 and instead bumps are preformed within cavity 338.

FIG. 6g further shows a mechanical support layer 346 formed over back surface 128 using printing, spin coating, spray coating, screen printing, stencil printing, jetting, lamination, or other suitable process. An optional cleaning process such as a laser clean, dry plasma, or wet development may also be used. Materials of mechanical support layer 346 include one or more layers of photosensitive polymer dielectric film with or without fillers, photosensitive composite resist, non-photosensitive polymer dielectric film, liquid crystal polymer (LCP), laminate compound film, insulation paste with filler, liquid molding compound, granular molding compound, polyimide, polymer flux, underfill, or other material having similar insulating and structural properties. One or more portions of mechanical support layer 346 are removed using LDA. Mechanical support layer 346 provides structural support, balances stress on the semiconductor package, and reduces warping and cracking. In one embodiment, mechanical support layer 346 is laminated on back surface 128 of semiconductor die 124 and encapsulant 325 before conducting laser ablation to expose conductive layer 318.

Figure 6H:
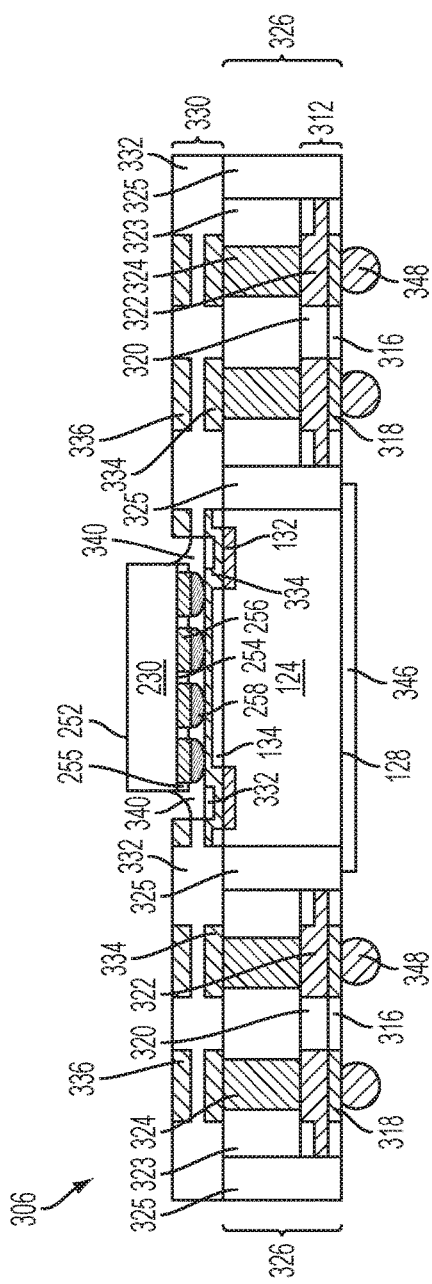

FIG. 6h shows semiconductor die 230 mounted within cavity 338 of interconnect structure 330 over active surface 130 of semiconductor die 124 as a semiconductor package 306. Carrier 308 and interface layer 310 are removed by chemical etching, mechanical peeling, chemical mechanical planarization CMP, mechanical grinding, thermal bake, UV light, laser scanning, or wet stripping. An optional cleaning process such as a laser clean, dry plasma, or wet development may also be used.

An optional underfill material 340 is disposed between semiconductor die 230 and active surface 130 around bumps 258. In some embodiments, as shown in FIG. 6h, semiconductor die 230 extends above a thickness of interconnect structure 330. Alternatively, semiconductor die 230 may comprise a thickness such that upon mounting semiconductor die 230 within cavity 338, back surface 252 is coplanar with a surface of interconnect structure 330 opposite the surface formed over interconnection units 326 or is below the surface. At least a portion of interconnection units 326 is completely embedded by encapsulant 325 and interconnect structure 330.

FIG. 6h further shows an electrically conductive bump material is deposited over conductive layer 318 of interconnection units 326 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 318 using a suitable attachment or bonding process. In one embodiment, the bump material is reflowed by heating the material above its melting point to form balls or bumps 348. In some applications, bumps 348 are reflowed a second time to improve electrical contact to conductive layer 318. In one embodiment, bumps 348 are formed over a UBM having a wetting layer, barrier layer, and adhesive layer. The bumps can also be compression bonded to conductive layer 318. Bumps 348 represent one type of interconnect structure that can be formed over conductive layer 318. The interconnect structure can also use conductive paste, stud bump, micro bump, or other electrical interconnect.

Modular interconnection units 326 disposed around semiconductor die 124 provide vertical interconnect with reduced RDL application. Interconnection units 326 disposed along one side or in an L-shaped configuration around semiconductor die 124, similar to FIG. 4c, provide structural support during packaging and reduce shifting during the application of encapsulant 325 and external semiconductor components such as semiconductor die 230. Interconnection units 326 can form a border, frame, slot, or other similar support structure around a side portion or portions or over a peripheral region of semiconductor die 124. Interconnection units 326 reduce the quantity of RDLs formed within a package. Interconnection units 326 provide partial backside RDL without the cost, time, and other manufacturing restraints associated with forming multiple RDLs in a semiconductor package. Interconnection units 326 provide design flexibility while reducing z-direction package height.

Bumps 258, or interconnect structures of an external device such as semiconductor die 230, can be disposed or formed on semiconductor die 230 in an orientation matching the layout or orientation of interconnection units 326 disposed around semiconductor die 124. Matching bumps 258 or interconnect structures of semiconductor die 230 with the layout of interconnection units 326 reduces manufacturing materials and cost. Matching interconnection units 326 with bumps 258 or interconnect structures of semiconductor die 230 provides a consistent and reliable 3D vertical interconnect.

Creating vertical interconnect by disposing interconnection units 326 as opposed to build-up layers and RDLs provides enhanced flexibility for packaging design. Interconnection units 326 do not have to be disposed over an entire surface area and can be disposed at customized locations within semiconductor package 306 package which is difficult to accomplish with other interconnect structures. For example, disposing interconnection units 326 over first side portions of the semiconductor die 124 and not around second side portions of the semiconductor die 124 can free valuable space within the semiconductor package 306 and expose the second side portions around semiconductor die 124 for additional electrical components. Alternatively, where increased vertical interconnect density is desired, interconnection units 326 can completely surround semiconductor die 124 for a dense yet flexible vertical interconnect. Interconnection units 326 help to conserve materials and also optimize the space within semiconductor package 306.

Figure 7:
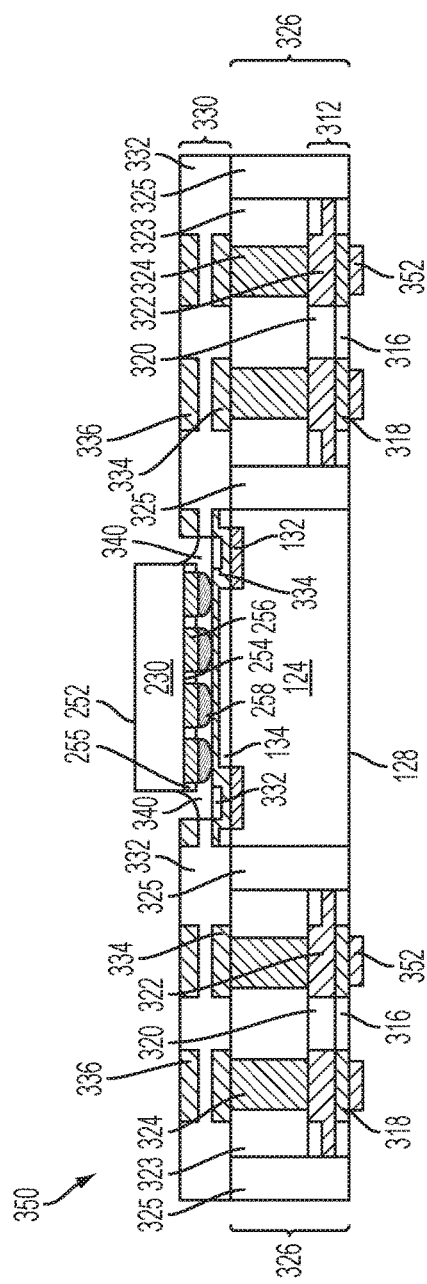
FIG. 7 illustrates an alternative embodiment of a semiconductor package with LGA pads.

FIG. 7 shows an alternative embodiment of a semiconductor package 350, formed with a process similar to the semiconductor package 306 in FIGS. 6a-6h. With semiconductor package 350, bumps 348 are removed and replaced with LGA pads 352 formed over or within interconnect layer 312. LGA pads 352 provide I/O instead of bumps 348 for the semiconductor package 350 to reduce a height or thickness of the package.

Mechanical support layer 346 is also removed from semiconductor package 350. The removal of mechanical support layer 346 and bumps 348 from semiconductor package 350 provides a reduced profile and reduces manufacturing steps. In some embodiments, semiconductor package 350 includes a bottom surface coplanar with back surface 128, bottom surface of interconnect layer 312, and a bottom surface of encapsulant 325. As such, a slim, yet robust profile is provided for semiconductor package 350.

Figure 8G:
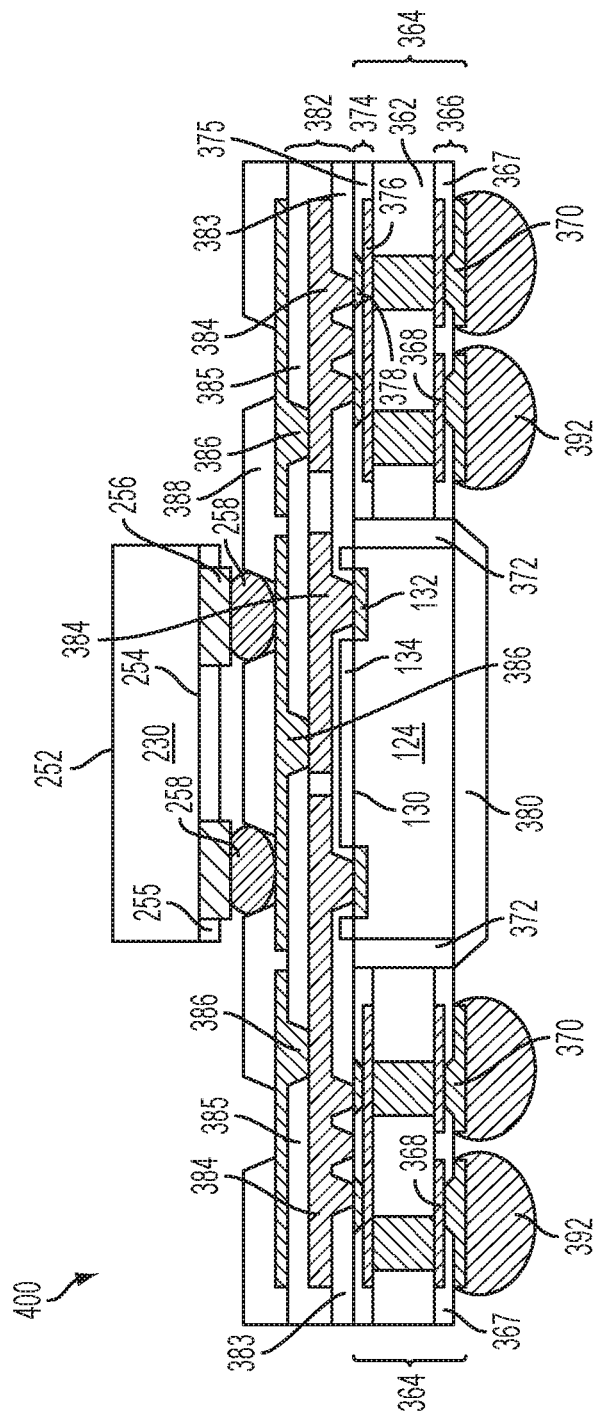

FIGS. 8a-8g illustrate a process flow for an alternative embodiment of a semiconductor package, formed with a process similar to the semiconductor package 306 illustrated in FIGS. 6a-6h. FIG. 8a shows a cross-sectional view of a portion of a carrier or temporary substrate 308, similar to carrier 140 of FIG. 4a, containing sacrificial base material such as silicon, polymer, beryllium oxide, glass, or other suitable low-cost, rigid material for structural support. An interface layer or double-sided tape 310 is formed over carrier 308 as a temporary adhesive bonding film, etch-stop layer, or thermal release layer.

FIG. 8a shows semiconductor die 124 from FIG. 3c mounted to interface layer 310 using, for example, a pick and place operation with active surface 130 oriented toward the carrier 308. Semiconductor die 124 mounted to die attach area 150 can be chosen from KGD. Semiconductor die 124 are pressed into interface layer 310 such that a portion of insulating layer 134 is disposed within and surrounded by the interface layer.

Prefabricated modular interconnection units or interconnect structures 364, similar to interconnection units 326 in FIG. 6a, are mounted to interface layer 310 with an optional adhesive. Similar to interconnection units 600, interconnection units 364 are prefabricated with a typical laminate substrate at the panel/strip level and singulated into individual interconnection units 364. Interconnection units 364 include interconnect layer 366, insulating layer 362, conductive material 363, and interconnect layer 374. Interconnection units 364 are disposed a distance from semiconductor die 124. A gap or space remains between semiconductor die 124 and interconnection units 364.

Interconnect layer 366 is part of interconnection units 364 and provides additional vertical interconnect including a Cu pad for interconnection units 364. As a part of interconnection units 364, interconnect layer 366 extends from and is within a footprint of interconnection units 364. Interconnect layer 366 includes an insulating or passivation layer 367 containing one or more layers of $SiO_2$, $Si_3N_4$, SiON, $Ta_2O_5$, $Al_2O_3$, or other material having similar insulating and structural properties. Insulating layer 367 is formed using PVD, CVD, printing, spin coating, spray coating, sintering or thermal oxidation.

Interconnect layer 366 further includes an electrically conductive layer 368 formed in insulating layer 367 using a patterning and metal deposition process such as PVD, CVD, sputtering, electrolytic plating, and electroless plating. Conductive layer 368 can be one or more layers of Al, Cu, Sn, Ni, Au, Ag, or other suitable electrically conductive material.

Interconnect layer 366 further includes an electrically conductive layer 370 formed in insulating layer 367 and over conductive layer 368 using a patterning and metal deposition process such as PVD, CVD, sputtering, electrolytic plating, and electroless plating. Conductive layer 370 can be one or more layers of Al, Cu, Sn, Ni, Au, Ag, or other suitable electrically conductive material. In some embodiments, a portion of conductive layer 370 is electrically connected to conductive layer 368. Other portions of conductive layer 370 can be electrically common or electrically isolated depending on the design and function of the semiconductor device. Conductive layer 370 forms Cu pads for interconnection units 364.

Interconnect layer 374, opposite interconnect layer 366, is part of interconnection units 364. As a part of interconnection units 364, interconnect layer 374 extends from and is within a footprint of interconnection units 364. Interconnect layer 374 includes an insulating or passivation layer 375 containing one or more layers of $SiO_2$, $Si_3N_4$, SiON, $Ta_2O_5$, $Al_2O_3$, or other material having similar insulating and structural properties. Insulating layer 375 is formed using PVD, CVD, printing, spin coating, spray coating, sintering or thermal oxidation.

Interconnect layer 374 further includes an electrically conductive layer 376 formed in insulating layer 375 using a patterning and metal deposition process such as PVD, CVD, sputtering, electrolytic plating, and electroless plating. Conductive layer 376 can be one or more layers of Al, Cu, Sn, Ni, Au, Ag, or other suitable electrically conductive material.

Interconnect layer 374 further includes an electrically conductive layer 378 formed in insulating layer 375 and over conductive layer 376 using a patterning and metal deposition process such as PVD, CVD, sputtering, electrolytic plating, and electroless plating. Conductive layer 378 can be one or more layers of Al, Cu, Sn, Ni, Au, Ag, or other suitable electrically conductive material. In some embodiments, a portion of conductive layer 378 is electrically connected to conductive layer 376. Other portions of conductive layer 378 can be electrically common or electrically isolated depending on the design and function of the semiconductor device.

FIG. 8b shows interconnection units 364 mounted to interface layer 310 around semiconductor die 124. Interconnection units 364 are mounted on interface layer 310 over a side portion of semiconductor die 124.

FIG. 8b further shows encapsulant or molding compound 372 deposited over semiconductor die 124, interconnection units 364, carrier 308, and interface layer 310 using a paste printing, compressive molding, transfer molding, liquid encapsulant molding, vacuum lamination, spin coating, or other suitable applicator. Alternatively, encapsulant 372 is applied using a chase mold. Encapsulant 372 can be polymer composite material, such as epoxy resin with filler, epoxy acrylate with filler, or polymer with proper filler. Encapsulant 372 is non-conductive and environmentally protects the semiconductor device from external elements and contaminants. Encapsulant 372 is formed over back surface 128 of semiconductor die 124.

In FIG. 8c, build-up interconnect structure 382 is formed over a surface of insulating layer 375, insulating layer 134, active surface 130, and encapsulant 372. Interconnect structure 382 includes an insulating or passivation layer 383 formed over encapsulant 372, insulating layer 134, insulating layer 375, conductive layer 378, and active surface 130. In some embodiments, insulating layer 383 contains one or more layers of low temperature curable polymer dielectric resist (i.e., cures at less than 260° C.) with or without filler, SiO2, Si3N4, SiON, Ta2O5, Al2O3, or other material having similar insulating and structural properties. Insulating layer 383 is deposited using PVD, CVD, printing, spin coating, spray coating, sintering, thermal oxidation, or other suitable process. A portion of insulating layer 383 is removed by LDA, etching, or other suitable process to form openings over conductive layer 132. The openings expose conductive layer 132 of semiconductor die 124 for subsequent electrical interconnect.

An electrically conductive layer 384 is formed over insulating layer 383, insulating layer 134, over semiconductor die 124 and interconnection units 364, and disposed within openings in insulating layer 383 to fill the openings and contact conductive layer 132. The one or more layers of conductive layer 384 include Al, Cu, Sn, Ni, Au, Ag, or other suitable electrically conductive material. The deposition of conductive layer 384 uses PVD, CVD, electrolytic plating, electroless plating, or other suitable process. In some embodiments, conductive layer 384 operates as an RDL to fan-out and extend electrical connection from semiconductor die 124 to points external to semiconductor die 124 such as interconnection units 364.

An insulating or passivation layer 385 is conformally applied to, and follows the contours of, insulating layer 383 and conductive layer 384. Insulating layer 385 contains one or more layers of low temperature curable polymer dielectric resist (i.e., cures at less than 260° C.) with or without filler, SiO2, Si3N4, SiON, Ta2O5, Al2O3, or other material having similar insulating and structural properties. Insulating layer 385 is deposited using PVD, CVD, printing, spin coating, spray coating, sintering, thermal oxidation, or other suitable process. A portion of insulating layer 385 is removed by an exposure or development process, LDA, etching, or other suitable process to form openings in the insulating layer, which expose portions of conductive layer 384 for subsequent electrical interconnection.

An electrically conductive layer 386 is formed over insulating layer 385, over conductive layer 384, and disposed within the openings in insulating layer 385 to fill the openings and contact conductive layer 384. The one or more layers of conductive layer 386 include Al, Cu, Sn, Ni, Au, Ag, or other suitable electrically conductive material. The deposition of conductive layer 386 uses PVD, CVD, electrolytic plating, electroless plating, or other suitable process. In some embodiments, conductive layer 386 operates as an RDL to fan-out and extend electrical connection from semiconductor die 124 to points external to semiconductor die 124.

In FIG. 8d, a surface of encapsulant 372 opposite interconnect structure 382 undergoes a grinding operation with grinder 206 to reduce a thickness of the encapsulant 372 similar to FIG. 6f. The grinding operation exposes conductive layer 370, as shown in FIG. 8e. Alternatively, or in combination with grinding operation, shallow LDA is used to expose conductive layer 370 of interconnection units 364 through encapsulant 372, as shown in FIG. 8e. In some embodiments, a chemical etch is used to remove one or more portions of encapsulant 372. FIG. 8e further shows a mechanical support layer 380 is formed over back surface 128 and encapsulant 372 using printing, spin coating, spray coating, screen printing, stencil printing, jetting, lamination, or other suitable process. An optional cleaning process such as a laser clean, dry plasma, or wet development may also be used. Materials of mechanical support layer 380 include one or more layers of photosensitive polymer dielectric film with or without fillers, photosensitive composite resist, non-photosensitive polymer dielectric film, LCP, laminate compound film, insulation paste with filler, liquid molding compound, granular molding compound, polyimide, polymer flux, underfill, or other material having similar insulating and structural properties. One or more portions of mechanical support layer 380 are removed by LDA.

In FIG. 8f, an insulating or passivation layer 388 is formed conformally over and follows the contours of conductive layer 386 and insulating layer 385. Insulating layer 388 contains one or more layers of low temperature curable polymer dielectric resist (i.e., cures at less than 260° C.) with or without filler, SiO2, Si3N4, SiON, Ta2O5, Al2O3, or other material having similar insulating and structural properties. Insulating layer 388 is deposited using PVD, CVD, printing, spin coating, spray coating, sintering, thermal oxidation, or other suitable process. A portion of insulating layer 388 is removed by an exposure or development process, LDA, etching, or other suitable process to form openings 390 in the insulating layer, which expose portions of conductive layer 386 for subsequent electrical interconnection. In some embodiments, insulating layer 388 comprises an encapsulant similar to encapsulant 372.

FIG. 8f further shows a semiconductor package, semiconductor die, or semiconductor component 230, singulated from a semiconductor wafer similar to FIGS. 3a-3c, is disposed over openings 390 in insulating layer 388. Using a pick and place operation, semiconductor die 230 is mounted over insulating layer 388 such that bumps 258 are disposed within openings 390 to bond with exposed portions of conductive layer 386. In some embodiments, semiconductor die 230 does not have bumps 258 and instead bumps are preformed within openings 390.

FIG. 8g shows semiconductor die 230 mounted over semiconductor die 124 with bumps 258 disposed within vias 390 of insulating layer 388 as a semiconductor package 400. An electrically conductive bump material is deposited over conductive layer 370 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 370 using a suitable attachment or bonding process. In one embodiment, the bump material is reflowed by heating the material above its melting point to form balls or bumps 392. In some applications, bumps 392 are reflowed a second time to improve electrical contact to conductive layer 370. In one embodiment, bumps 392 are formed over a UBM having a wetting layer, barrier layer, and adhesive layer. The bumps can also be compression bonded to conductive layer 370. Bumps 392 represent one type of interconnect structure that can be formed over conductive layer 370. The interconnect structure can also use conductive paste, stud bump, micro bump, or other electrical interconnect.

Modular interconnection units 364 disposed around semiconductor die 124 provide vertical interconnect with reduced RDL application. Interconnection units 364 formed along one side or in an L-shaped configuration around semiconductor die 124, similar to FIG. 4c, provide structural support during packaging and reduce shifting during the application of encapsulant 372 and external semiconductor components such as semiconductor die 230. Interconnection units 364 can form a border, frame, slot, or other similar support structure around a side portion or portions or over a peripheral region of semiconductor die 124. Interconnection units 364 increase structural support and reduce shifting of the semiconductor device 124 during encapsulation. Interconnection units 364 reduce the quantity of RDLs formed within a package. Interconnection units 364 provide partial backside RDL without the cost, time, and other manufacturing restraints associated with forming multiple RDLs in a semiconductor package. Interconnection units 364 provide design flexibility while reducing z-direction package height. Mechanical support layer 380 is a backside protection/balance layer that provides structural support for semiconductor package 400, balances stress on semiconductor package 400, and reduces warping or cracking of semiconductor package 400.

Bumps 258, or interconnect structures of an external device such as semiconductor die 230, can be disposed or formed on semiconductor die 230 in an orientation matching the layout or orientation of interconnection units 364 disposed around semiconductor die 124. Matching bumps 258 or interconnect structures of semiconductor die 230 with the layout of interconnection units 364 reduces manufacturing materials and cost. Matching interconnection units 364 with bumps 258 or interconnect structures of semiconductor die 230 provides a consistent and reliable 3D vertical interconnect.

Creating vertical interconnect by forming interconnection units 364 as opposed to build-up layers and RDLs provides enhanced flexibility for packaging design. Interconnection units 364 do not have to be disposed over an entire surface area and can be disposed at customized locations within semiconductor package 400 which is difficult to accomplish with other interconnect structures. For example, disposing interconnection units 364 over first side portions of the semiconductor die 124 and not around second side portions of the semiconductor die 124 can free valuable space within semiconductor package 400 and expose the second side portions around semiconductor die 124 for additional electrical components. Alternatively, where increased vertical interconnect density is desired, interconnection units 364 can completely surround semiconductor die 124 for a dense yet flexible vertical interconnect. Interconnection units 364 help to conserve materials and also optimize the space within semiconductor package 400.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
   providing a first semiconductor die;
   disposing the first semiconductor die on a carrier with an active surface of the first semiconductor die oriented toward the carrier;
   disposing a modular interconnect unit on the carrier adjacent to the first semiconductor die;
   removing the carrier to expose a surface of the modular interconnect unit and the active surface of the first semiconductor die;
   forming a build-up interconnect structure over the active surface of the first semiconductor die and the surface of the modular interconnect unit; and
   disposing a second semiconductor die over the modular interconnect unit and first semiconductor die opposite the build-up interconnect structure, wherein the second semiconductor die is coupled to the build-up interconnect structure through the modular interconnect unit.

2. The method of claim 1, further including:
   depositing an encapsulant over the first semiconductor die and modular interconnect unit;
   removing the carrier after depositing the encapsulant; and
   forming the build-up interconnect structure over the encapsulant.

3. The method of claim 2, further including:
   forming an opening in the encapsulant over the modular interconnect unit; and
   disposing an interconnect structure in the opening to couple the second semiconductor die to the modular interconnect unit.

4. The method of claim 2, wherein a surface of the encapsulant is coplanar with the surface of the modular interconnect unit and the active surface of the first semiconductor die.

5. The method of claim 1, further including providing an underfill dot between the first semiconductor die and second semiconductor die.

6. The method of claim 1, wherein the first semiconductor die extends outside a footprint of the second semiconductor die opposite the modular interconnect unit.

7. A method of making a semiconductor device, comprising:
providing a semiconductor die;
disposing a modular interconnect unit adjacent to the semiconductor die, wherein a surface of the modular interconnect unit is coplanar with an active surface of the semiconductor die; and
disposing a semiconductor component over the modular interconnect unit and a non-active surface of the semiconductor die.

8. The method of claim 7, further including providing an underfill dot between the semiconductor die and semiconductor component.

9. The method of claim 7, further including:
disposing the semiconductor die and modular interconnect unit on a carrier;
depositing an encapsulant over the carrier, semiconductor die, and modular interconnect unit; and
removing the carrier after depositing the encapsulant.

10. The method of claim 9, further including forming a build-up interconnect structure over the semiconductor die, modular interconnect unit, and encapsulant.

11. The method of claim 10, wherein the semiconductor component is coupled to the build-up interconnect structure through the modular interconnect unit.

12. The method of claim 7, wherein the semiconductor die extends outside a footprint of the semiconductor component.

13. The method of claim 7, further including forming:
forming an insulating layer over the semiconductor die; and
disposing the semiconductor component over the semiconductor die and modular interconnect unit with the insulating layer supporting the semiconductor component between the semiconductor die and semiconductor component.

14. A semiconductor device, comprising:
a first semiconductor die;
a modular interconnect unit disposed adjacent to the first semiconductor die, wherein a surface of the modular interconnect unit is coplanar with an active surface of the semiconductor die;
a build-up interconnect structure formed over the active surface of the first semiconductor die and the surface of the modular interconnect unit; and
a second semiconductor die disposed over the modular interconnect unit and a non-active surface of the first semiconductor die, wherein the second semiconductor die is coupled to the build-up interconnect structure through the modular interconnect unit.

15. The semiconductor device of claim 14, further including an encapsulant deposited over the first semiconductor die and modular interconnect unit.

16. The semiconductor device of claim 15, further including an opening formed in the encapsulant over the modular interconnect unit, wherein the second semiconductor die is coupled to the modular interconnect unit through the opening.

17. The semiconductor device of claim 14, further including an underfill dot disposed between the first semiconductor die and second semiconductor die.

18. The semiconductor device of claim 14, wherein the first semiconductor die extends outside a footprint of the second semiconductor die.

19. The semiconductor device of claim 14, wherein the modular interconnect unit includes an 'L' shape.

20. A semiconductor device, comprising:
a semiconductor die;
a modular interconnect unit;
an encapsulant deposited over the semiconductor die and modular interconnect unit, wherein the semiconductor die and modular interconnect unit are embedded in the encapsulant; and
a semiconductor component disposed over the modular interconnect unit, semiconductor die, and encapsulant.

21. The semiconductor device of claim 20, further including an underfill dot disposed between the semiconductor die and semiconductor component.

22. The semiconductor device of claim 21, further including a conductive bump extending from the modular interconnect unit to the semiconductor component, wherein the underfill dot supports a first side of the semiconductor component and the conductive bump supports a second side of the semiconductor component opposite the conductive bump.

23. The semiconductor device of claim 20, further including a build-up interconnect structure formed over the semiconductor die, modular interconnect unit, and encapsulant.

24. The semiconductor device of claim 23, wherein the semiconductor die is coupled to the build-up interconnect structure through the modular interconnect unit.

25. The semiconductor device of claim 20, wherein a surface of the modular interconnect unit is coplanar with a surface of the semiconductor die and a surface of the encapsulant.

* * * * *